(12) United States Patent
Lin

(10) Patent No.: US 12,237,042 B2
(45) Date of Patent: *Feb. 25, 2025

(54) DATA RECEIVING CIRCUIT, DATA RECEIVING SYSTEM AND MEMORY DEVICE

(71) Applicant: CHANGXIN MEMORY TECHNOLOGIES, INC., Hefei (CN)

(72) Inventor: Feng Lin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 261 days.

This patent is subject to a terminal disclaimer.

(21) Appl. No.: 17/952,394

(22) Filed: Sep. 26, 2022

(65) Prior Publication Data

US 2023/0016678 A1  Jan. 19, 2023

Related U.S. Application Data

(63) Continuation of application No. PCT/CN2022/104757, filed on Jul. 8, 2022.

(30) Foreign Application Priority Data

Jun. 23, 2022  (CN) .......................... 202210766628.4

(51) Int. Cl.
*G11C 7/10* (2006.01)
*G11C 7/22* (2006.01)
(Continued)

(52) U.S. Cl.
CPC .......... *G11C 7/1048* (2013.01); *G11C 7/1078* (2013.01); *G11C 7/1084* (2013.01);
(Continued)

(58) Field of Classification Search
CPC ... G11C 7/1048; G11C 7/1084; G11C 7/1087; G11C 7/222; G11C 7/02; G11C 7/1093;
(Continued)

(56) References Cited

U.S. PATENT DOCUMENTS 6,151,648 A  11/2000 Haq
6,160,423 A  12/2000 Haq
(Continued)

FOREIGN PATENT DOCUMENTS

CN  104183258 A  12/2014
CN  108694962 A  10/2018
(Continued)

OTHER PUBLICATIONS

Supplementary European Search Report in the European application No. 22854456.5, mailed on Feb. 7, 2024, 10 pages.
(Continued)

*Primary Examiner* — Hoai V Ho
*Assistant Examiner* — Justin Bryce Heisterkamp
(74) *Attorney, Agent, or Firm* — Syncoda LLC; Feng Ma

(57) ABSTRACT

Provided is data receiving circuit, data receiving system and memory device. The data receiving circuit includes: first amplification circuit, configured to receive data signal, first reference signal and second reference signal, perform first comparison on the data signal and the first reference signal in response to sampling clock signal and output first signal pair, and perform second comparison on the data signal and the second reference signal and output second signal pair; second amplification circuit, configured to receive enable signal and feedback signal, selectively receive the first signal pair or the second signal pair as input signal pair based on the feedback signal during period in which the enable signal is at first level, receive the first signal pair during period in which the enable signal is at second level,
(Continued)

amplify voltage difference of the first signal pair, and output first output signal and second output signal.

19 Claims, 6 Drawing Sheets

(51) Int. Cl.
*H03F 3/45* (2006.01)
*G11C 7/02* (2006.01)
(52) U.S. Cl.
CPC .......... *G11C 7/1087* (2013.01); *G11C 7/1093* (2013.01); *G11C 7/222* (2013.01); *H03F 3/45183* (2013.01); *G11C 7/02* (2013.01)
(58) Field of Classification Search
CPC ................ G11C 7/1078; H03K 5/2481; H04L 25/03267; H03F 3/45183
See application file for complete search history.

(56) References Cited

U.S. PATENT DOCUMENTS

| | | | |
|---|---|---|---|
| 6,504,778 | B1 | 1/2003 | Ekubo |
| 7,477,704 | B1 | 1/2009 | Cornelius |
| 9,542,991 | B1 | 1/2017 | Xie |
| 9,806,918 | B1 | 10/2017 | Su |
| 10,091,031 | B1* | 10/2018 | Dimitriu ............. G11C 11/4093 |
| 2001/0020853 | A1 | 9/2001 | Haq |
| 2005/0040867 | A1 | 2/2005 | Haq |
| 2005/0242847 | A1 | 11/2005 | Haq |
| 2006/0012402 | A1 | 1/2006 | Haq |
| 2007/0201291 | A1 | 8/2007 | Cho |
| 2008/0008011 | A1* | 1/2008 | Moon ................. G11C 7/1096 |
| | | | 365/189.05 |
| 2008/0088365 | A1 | 4/2008 | Jang |
| 2008/0089155 | A1 | 4/2008 | Bae |
| 2009/0296508 | A1 | 12/2009 | Cho |
| 2010/0246693 | A1 | 9/2010 | Ushio et al. |
| 2012/0063242 | A1* | 3/2012 | Kim ..................... G11C 7/1087 |
| | | | 365/189.05 |
| 2014/0347098 | A1 | 11/2014 | Ecker et al. |
| 2018/0294784 | A1 | 10/2018 | Kim et al. |
| 2019/0068145 | A1* | 2/2019 | Lee ..................... G11C 7/1084 |
| 2019/0222444 | A1 | 7/2019 | Sreeramaneni et al. |
| 2020/0119955 | A1 | 4/2020 | Ahn |
| 2020/0194043 | A1* | 6/2020 | Karim ................. G11C 7/1039 |
| 2021/0174844 | A1* | 6/2021 | Choi ..................... G11C 16/24 |
| 2021/0194665 | A1* | 6/2021 | An ....................... G11C 7/1093 |
| 2021/0408970 | A1* | 12/2021 | Hong ........................ H03F 3/19 |
| 2022/0173744 | A1* | 6/2022 | Lee ....................... H03K 5/2481 |
| 2023/0012066 | A1* | 1/2023 | Gu .................... H04L 25/03146 |
| 2023/0016678 | A1 | 1/2023 | Lin |
| 2023/0421103 | A1* | 12/2023 | Lin ........................... H03F 3/16 |
| 2024/0005966 | A1 | 1/2024 | Lin |

FOREIGN PATENT DOCUMENTS

| | | |
|---|---|---|
| CN | 109328434 A | 2/2019 |
| CN | 111049540 A | 4/2020 |
| CN | 111052240 A | 4/2020 |
| CN | 111614332 A | 9/2020 |
| CN | 112204662 A | 1/2021 |
| CN | 113556104 A | 10/2021 |
| CN | 113852367 A | 12/2021 |
| KR | 20120027586 A | 3/2012 |
| KR | 20210073217 A | 6/2021 |

OTHER PUBLICATIONS

US office action in U.S. Appl. No. 18/154,794, mailed on Sep. 28, 2024.
KR first office action in application No. 10-2023-7003894, mailed on Sep. 27, 2024.

* cited by examiner

DATA RECEIVING CIRCUIT, DATA RECEIVING SYSTEM AND MEMORY DEVICE

CROSS-REFERENCE TO RELATED APPLICATIONS

This is a continuation of International Application No. PCT/CN2022/104757, filed on Jul. 8, 2022, which is based upon and claims priority to Chinese Patent Application No. 202210726628.4, filed on Jun. 23, 2022 and entitled "DATA RECEIVING CIRCUIT, DATA RECEIVING SYSTEM AND MEMORY DEVICE". The disclosures of International Application No. PCT/CN2022/104757 and Chinese Patent Application No. 202210726628.4 are hereby incorporated by reference in their entireties.

TECHNICAL FIELD

Embodiments of the disclosure relate to the technical field of semiconductors, and in particular, to a data receiving circuit, a data receiving system and a memory device.

BACKGROUND

In the application of memories, as a signal transmission rate becomes faster, channel loss has a greater impact on the signal quality, which may easily lead to intersymbol interference. In addition, a deviation between a level of a data signal received by a data receiving circuit in the memory and a level of a reference signal may affect the data receiving circuit on determination of the data signal, thus affecting the accuracy of the signal outputted by the data receiving circuit.

Currently, a channel is usually compensated by an equalization circuit. The equalization circuit may select a Continuous Time Linear Equalizer (CTLE) or a Decision Feedback Equalizer (DFE). However, the accuracy of the signal output by the equalization circuit currently used needs to be improved, the receiving performance of the equalization circuit needs to be improved, and the power consumption of the equalization circuit needs to be reduced.

SUMMARY

Embodiments of the disclosure provide a data receiving circuit, a data receiving system and a memory device.

According to some embodiments of the disclosure, an aspect of an embodiment of the disclosure provides a data receiving circuit, including: a first amplification circuit, configured to receive a data signal, a first reference signal and a second reference signal, perform first comparison on the data signal and the first reference signal in response to a sampling clock signal and output a first signal pair as a result of the first comparison, perform second comparison on the data signal and the second reference signal and output a second signal pair as a result of the second comparison, where a level of the first reference signal is different from a level of the second reference signal, the first signal pair includes a first signal and a second signal, and the second signal pair includes a third signal and a fourth signal; and a second amplification circuit, configured to receive an enable signal and a feedback signal, selectively receive the first signal pair or the second signal pair as an input signal pair based on the feedback signal during a period in which the enable signal is at a first level, receive the first signal pair as the input signal pair during a period in which the enable signal is at a second level, amplify a voltage difference of the input signal pair, and output a first output signal and a second output signal as an amplification result. The feedback signal is obtained based on previously received data.

According to some embodiments of the disclosure, another aspect of an embodiment of the disclosure further provides a data receiving system, including: a plurality of cascaded data transmission circuits, each of which includes any of the data receiving circuits described above and a latch circuit connected to the data receiving circuit. An output signal of the data transmission circuit at a previous stage is used as a feedback signal of the data transmission circuit at a subsequent stage. An output signal of the data transmission circuit at a last stage is used as the feedback signal of the data transmission circuit at a first stage.

According to some embodiments of the disclosure, still another aspect of an embodiment of the disclosure further provides a memory device, including: a plurality of data ports; and a plurality of data receiving systems described above, each of which corresponds to a respective one of the data ports.

BRIEF DESCRIPTION OF THE DRAWINGS

One or more embodiments are exemplified by the figures in the corresponding drawings, and these exemplary descriptions do not constitute limitations of the embodiments. Elements in the drawings with the same reference numerals are represented as similar elements. Unless otherwise stated, the figures in the drawings do not constitute a scale limitation. In order to more clearly illustrate the technical solutions in the embodiments of the disclosure or conventional technologies, the drawings used in the technical description of the embodiments will be briefly described below. It is apparent that the drawings in the following descriptions are merely some embodiments of the disclosure. Other drawings can be obtained from those skilled in the art according to these drawings without any creative work.

DETAILED DESCRIPTION

It may be known from the Background that, the signal adjustment capability of an equalization circuit needs to be improved, and the power consumption of the equalization circuit needs to be reduced.

Embodiments of the disclosure provide a data receiving circuit, a data receiving system and a memory device. In the data receiving circuit, the second amplification circuit may be further controlled by means of an enable signal, so as to select whether to consider the impact of the intersymbol interference of data received by the data receiving circuit on the data receiving circuit. For example, when the impact of the intersymbol interference on the data receiving circuit is required to be reduced, the enable signal is set to be at a first level, the second amplification circuit selectively receives one of the first signal pair and the second signal pair that has a larger level difference based on the current enable signal and the feedback signal, so as to ensure that the second amplification circuit receives a pair of differential signals with a larger signal level difference. When the impact of the intersymbol interference on the data receiving circuit is not required to be considered, the enable signal is set to be at a second level, and the second amplification circuit keeps receiving the first signal pair based on the current enable signal, so as to achieve effects of reducing the power consumption of the data receiving circuit while improving the receiving performance of the data receiving circuit.

Embodiments of the disclosure are described in detail below with reference to the drawings. However, it is to be understood by those skilled in the art that, in each embodiment of the disclosure, many technical details are provided for readers to better understand the embodiments of the disclosure. However, even without these technical details and various changes and modifications based on the following embodiments, the technical solutions claimed in the embodiments of the disclosure may also be realized.

Figure 1:
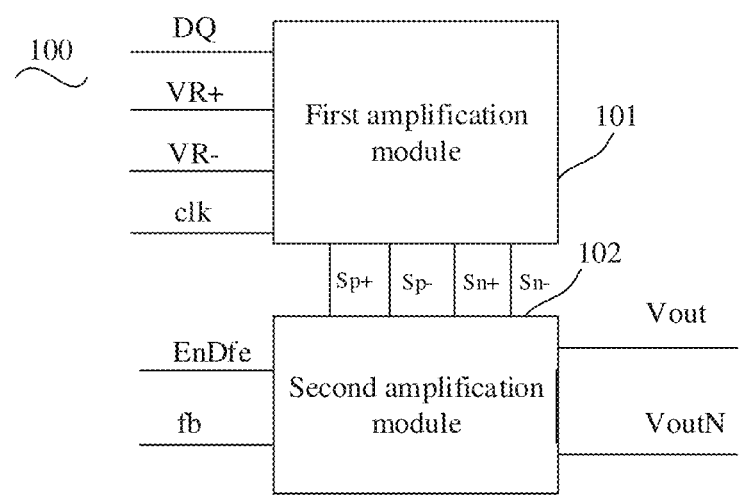
FIG. 1 is a functional block diagram of a data receiving circuit according to an embodiment of the disclosure.
Figure 3:
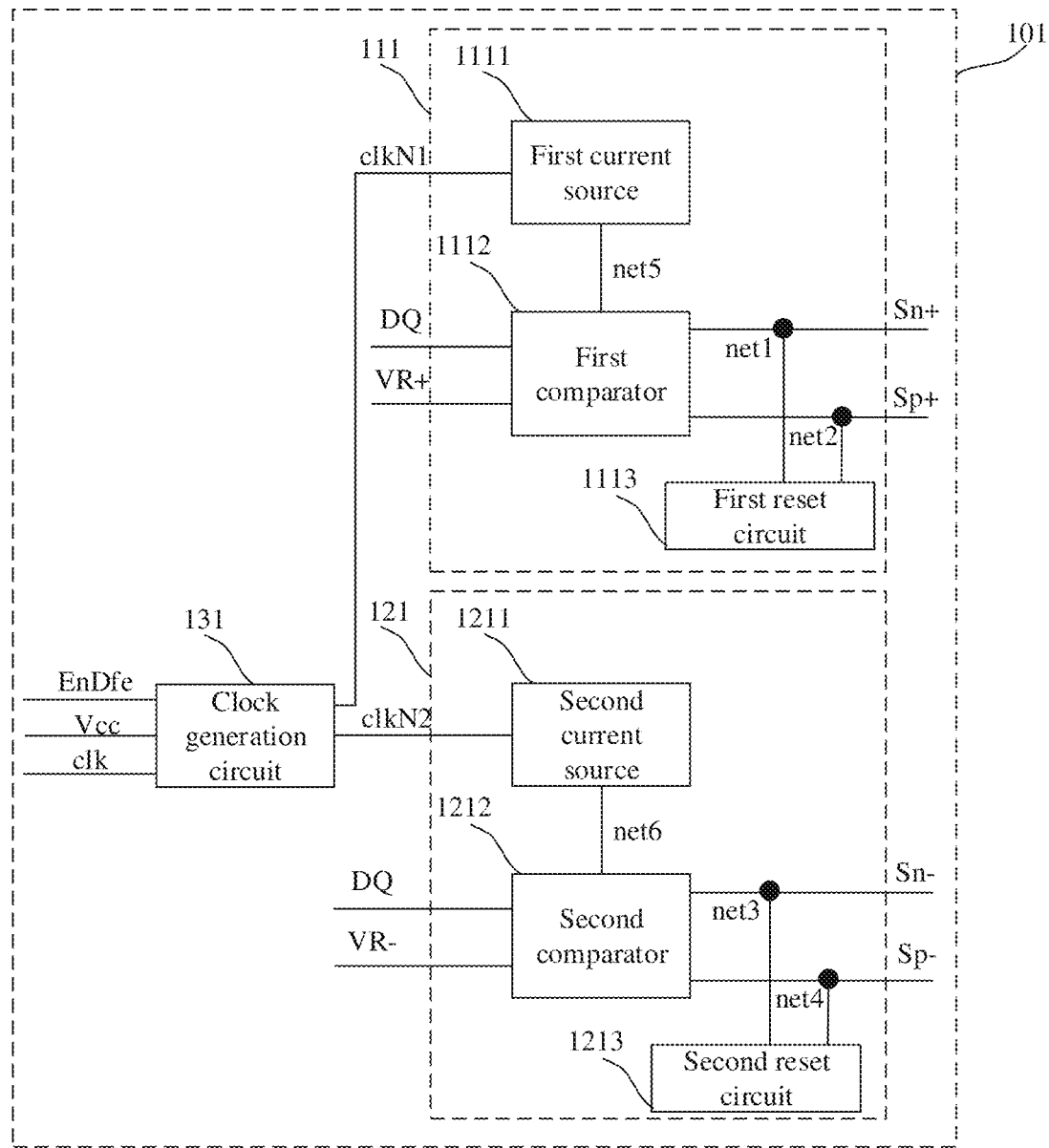
FIG. 3 to FIG. 4 are another two functional block diagrams of a data receiving circuit according to an embodiment of the disclosure.
Figure 4:
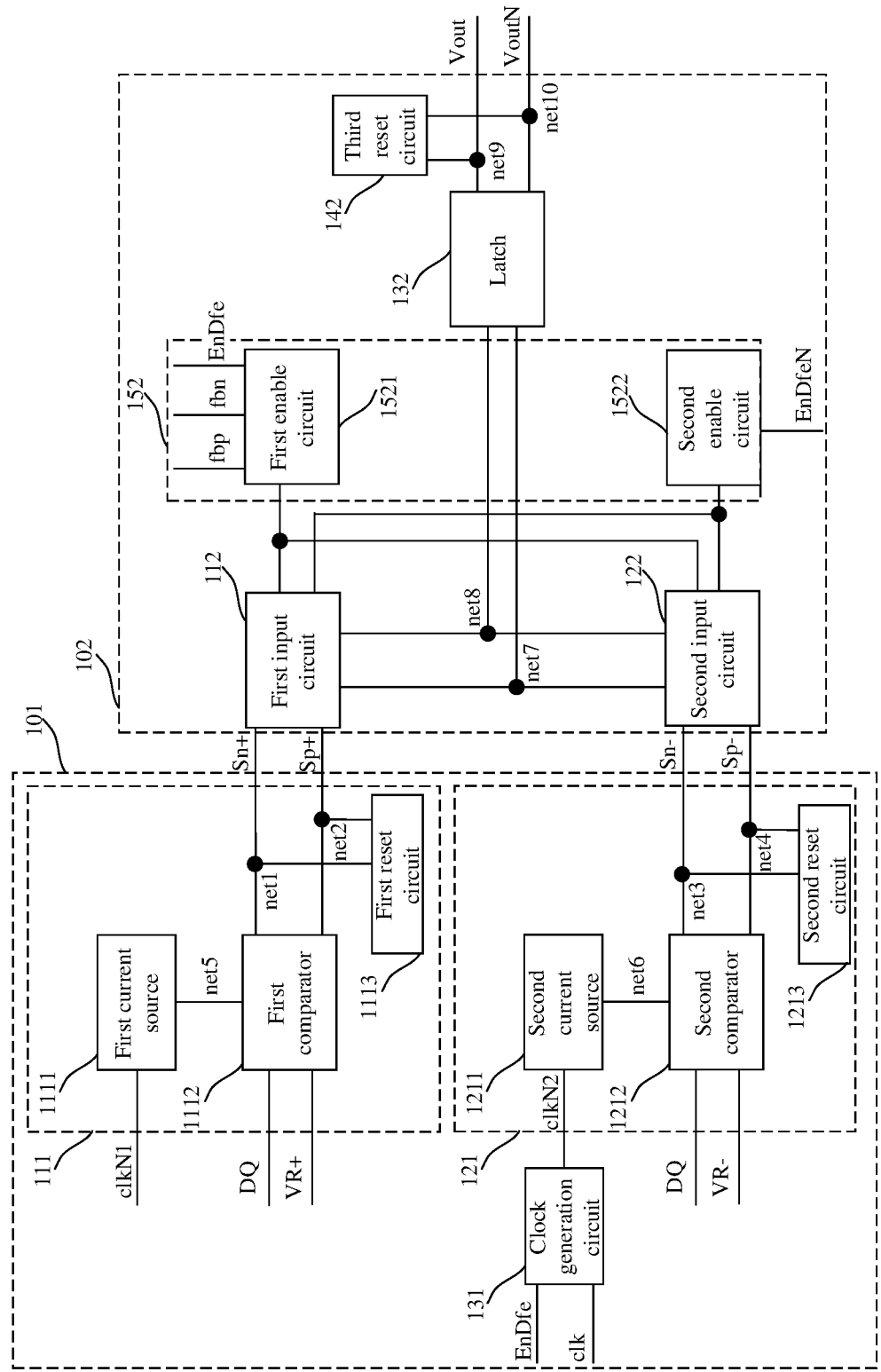
Figure 5:
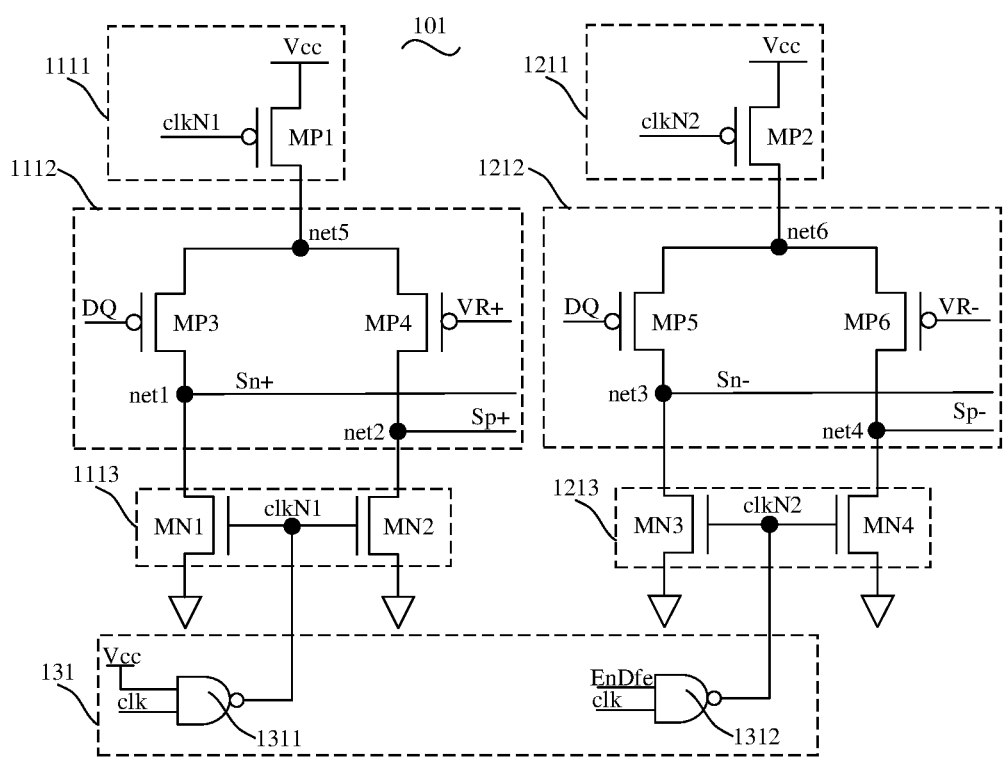
FIG. 5 is a schematic diagram of a circuit structure of a first amplification circuit in a data receiving circuit according to an embodiment of the disclosure.
Figure 6:
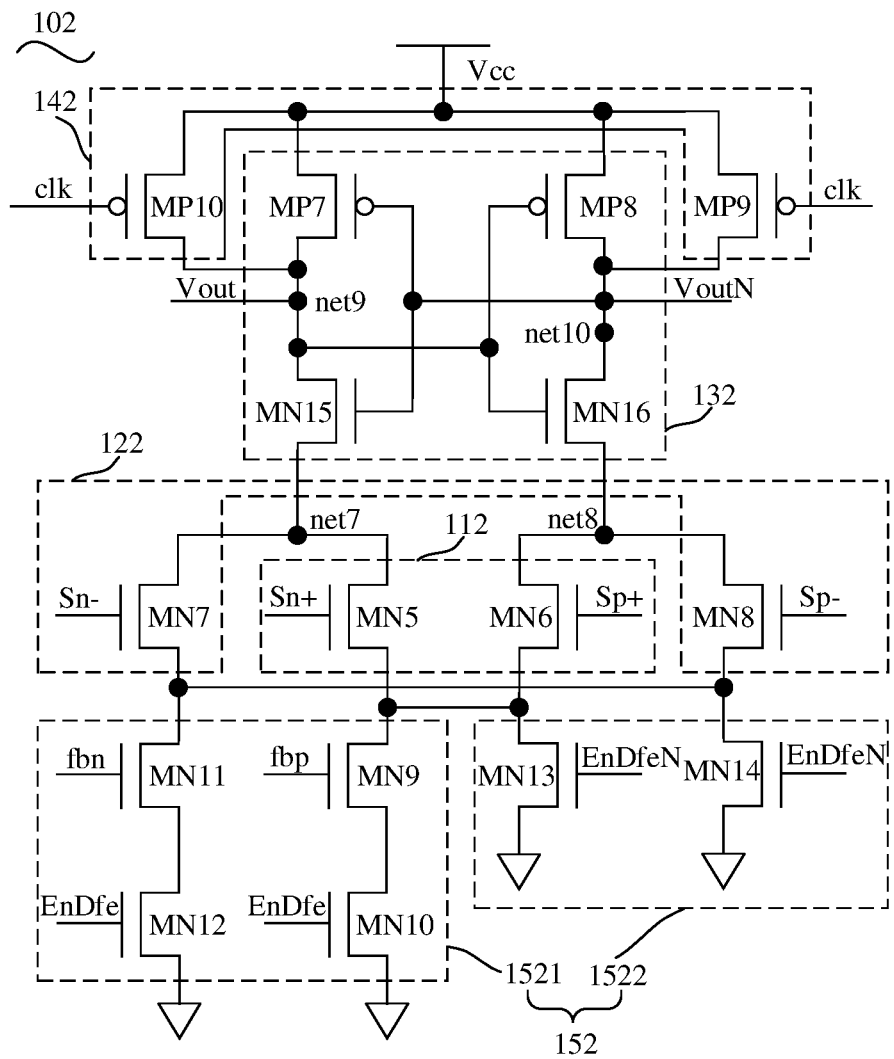
FIG. 6 is a schematic diagram of a circuit structure of a second amplification circuit in a data receiving circuit according to an embodiment of the disclosure.

An embodiment of the disclosure provides a data receiving circuit. The data receiving circuit provided in this embodiment of the disclosure is described in detail below with reference to the drawings. FIG. 1 is a functional block diagram of a data receiving circuit according to an embodiment of the disclosure. FIG. 3 to FIG. 4 are another two functional block diagrams of a data receiving circuit according to an embodiment of the disclosure. FIG. 5 is a schematic diagram of a circuit structure of a first amplification circuit in a data receiving circuit according to an embodiment of the disclosure. FIG. 6 is a schematic diagram of a circuit structure of a second amplification circuit in a data receiving circuit according to an embodiment of the disclosure.

Referring to FIG. 1 and FIG. 3, the data receiving circuit 100 includes: a first amplification circuit 101 and a second amplification circuit 102. The first amplification circuit 101 is configured to receive a data signal DQ, a first reference signal VR+ and a second reference signal VR−, perform first comparison on the data signal DQ and the first reference signal VR+ in response to a sampling clock signal clkN, output a first signal pair as a result of the first comparison, perform second comparison on the data signal DQ and the second reference signal VR−, and output a second signal pair as a result of the second comparison, where a level of the first reference signal VR+ is different from a level of the second reference signal VR−, the first signal pair includes a first signal Sn+ and a second signal Sp+, and the second signal pair includes a third signal Sn− and a fourth signal Sp−. The second amplification circuit 102 is configured to receive an enable signal EnDfe and a feedback signal fb, selectively receive the first signal pair or the second signal pair as an input signal pair based on the feedback signal fb during a period in which the enable signal EnDfe is at the first level, receive the first signal pair as the input signal pair during a period in which the enable signal EnDfe is at the second level, amplify a voltage difference of the input signal pair, and output a first output signal Vout and a second output signal VoutN as an amplification result. The feedback signal fb is obtained based on previously received data.

It may be understood that, during a period in which the enable signal EnDfe is at the first level, based on different previously received feedback signals fb, the second amplification circuit 102 may selectively receive one of the first signal pair and the second signal pair that has a larger level difference based on the current feedback signal fb, to ensure that the second amplification circuit 102 receives a pair of differential signals with a larger signal level difference, so as to reduce the impact of intersymbol interference of the received data signal on the data receiving circuit 100. It is to be noted that, the level of the first reference signal VR+ is different from the level of the second reference signal VR−. For data signals DQ with different levels, the data signal DQ may have a larger level difference from that of one of the first reference signal VR+ and the second reference signal VR−, so that the first amplification circuit 101 can amplify the level difference, resulting in that the signal level difference of at least one of the first signal pair and the second signal pair outputted by the first amplification circuit 101 is relatively large. Therefore, when there is an intersymbol interference phenomenon in the data signal DQ received by the data receiving circuit 100, the second amplification circuit 102 may subsequently receive one of the first signal pair and the second signal pair, that has a larger level difference, based on the enable signal EnDfe and the feedback signal fb. It may be understood that, the data receiving circuit 100 may enhance the ability of the data receiving circuit 100 on adjusting the received data signal DQ by using the first reference signal VR+ and the second reference signal VR−. That is to say, when there is an intersymbol interference phenomenon in the data signal DQ received by the data receiving circuit 100, the second amplification circuit 102 receives, based on the enable signal EnDfe and the feedback signal fb, a signal pair in the first amplification circuit 101 that better processes the data signal DQ. The signal pair that better processes the data signal DQ is one of the first signal pair and the second signal pair that has a larger level difference. Therefore, the purpose of reducing the impact of the intersymbol interference of the received data signal DQ on the data receiving circuit 100 can be realized.

In addition, the second amplification circuit 102 selectively receives the one of the first signal pair and the second signal pair that has a larger level difference based on the feedback signal fb, so as to guarantee that the second amplification circuit 102 receives a pair of differential signals with a larger signal level difference. Therefore, the accuracy of the first output signal Vout and the second output signal VoutN outputted by the second amplification circuit 102 can be enhanced. Therefore, through the cooperation of the first amplification circuit 101 and the second amplification circuit 102, the receiving performance of the data receiving circuit 100 is improved.

In another aspect, during a period in which the enable signal EnDfe is at the second level, regardless of variance of the level of the previously received feedback signal fb, the second amplification circuit 102 keeps receiving the first signal pair based on the enable signal EnDfe. In this case, a circuit for outputting the second signal pair in the first amplification circuit 101 may be in a non-operating state, so that the power consumption of the data receiving circuit 100 can be reduced.

Based on the analysis, it may be learned that, the enable signal EnDfe may be used to determine whether to consider the impact of the intersymbol interference of data received by the data receiving circuit 100 on the data receiving circuit 100, so as to implement further control of the second amplification circuit 102, thereby achieving the effects of reducing the power consumption of the data receiving circuit 100 while improving the receiving performance of the data receiving circuit 100. It is to be noted that, a situation in which the intersymbol interference needs to be considered generally refers to a situation in which the data signal DQ received by the data receiving circuit 100 is high-speed data, that is, a situation in which a data transfer rate is very fast. A situation in which the intersymbol interference does not need to be considered generally refers to a situation in which the data signal DQ received by the data receiving circuit 100 is low-speed data, that is, a situation in which the data transfer rate is relatively slow.

How the data receiving circuit 100 reduces the impact of the intersymbol interference of the received data signal DQ on the data receiving circuit 100 is described in detail below with reference to a specific example.

In some embodiments, the level of the first reference signal VR+ is higher than the level of the second reference signal VR−. If the data signal DQ is at a low level and there is an intersymbol interference phenomenon in the data signal DQ received by the data receiving circuit 100, the enable signal EnDfe is set at the first level, and the second amplification circuit 102 receives the first signal pair based on the current enable signal EnDfe and the feedback signal fb. In this case, the level difference between the data signal DQ and the first reference signal VR+ is greater than the level difference between the data signal DQ and the second reference signal VR−, so that the level difference between the signals in the first signal pair outputted by the first amplification circuit 101 is greater than the level difference between the signals in the second signal pair. Therefore, the second amplification circuit 102 receives the first signal pair, which facilitates the outputting of the first output signal Vout and the second output signal VoutN that meet requirements, that is, the accuracy of the first output signal Vout and the second output signal VoutN is guaranteed. Therefore, the impact of the intersymbol interference of the received data signal DQ on the data receiving circuit 100 can be reduced.

In addition, if the data signal DQ is at a high level and there is an intersymbol interference phenomenon in the data signal DQ received by the data receiving circuit 100, the enable signal EnDfe is set at the first level, the second amplification circuit 102 receives the second signal pair based on the current enable signal EnDfe and the feedback signal fb. In this case, the level difference between the data signal DQ and the first reference signal VR+ is less than the level difference between the data signal DQ and the second reference signal VR−, so that the level difference between the signals in the first signal pair outputted by the first amplification circuit 101 is less than the level difference between the signals in the second signal pair. Therefore, the second amplification circuit 102 receives the second signal pair, which facilitates the outputting of the first output signal Vout and the second output signal VoutN that meet requirements, that is, the accuracy of the first output signal Vout and the second output signal VoutN is guaranteed. Therefore, the impact of the intersymbol interference of the received data signal DQ on the data receiving circuit 100 can be reduced.

It may be understood that, during the period in which the enable signal EnDfe is at the first level, the second amplification circuit 102 selectively receives one of the first signal pair and the second signal pair that has a larger level difference based on the feedback signal fb with a varying level, to enhance the accuracy of the first output signal Vout and the second output signal VoutN outputted by the second amplification circuit 102, so that the impact of the intersymbol interference of the received data signal DQ on the data receiving circuit 100 can be reduced.

In some embodiments, referring to FIG. 3 to FIG. 5, the first amplification circuit 101 may further be configured to receive the enable signal EnDfe, perform the first comparison and the second comparison to respectively output the first signal pair and the second signal pair during a period in which the enable signal EnDfe is at the first level, and merely perform the first comparison to output the first signal pair during a period in which the enable signal EnDfe is at the second level. A level of the first reference signal VR+ is greater than a level of the second reference signal VR−.

It may be understood that, whether the second comparison is performed can be determined by using the enable signal EnDfe to further control the first amplification circuit 101. For example, when the impact of the intersymbol interference on the data receiving circuit 100 is required to be reduced, the enable signal is set to be at the first level, and the first amplification circuit 101 performs the first comparison and the second comparison to output the first signal pair and the second signal pair respectively based on the current enable signal EnDfe. Then, the second amplification circuit 102 selectively receives one of the first signal pair and the second signal pair that has a larger level difference based on the enable signal EnDfe and the feedback signal fb, so as to ensure that the second amplification circuit receives a pair of differential signals with a larger signal level difference. When the impact of the intersymbol interference on the data receiving circuit 100 is not required to be considered, the enable signal EnDfe is set to be at the second level, and the first amplification circuit 101 only performs the first comparison based on the current enable signal EnDfe, to output the first signal pair having a difference in the level. Then, the second amplification circuit 102 keeps receiving the first signal pair based on the current enable signal EnDfe. In this case, the first amplification circuit 101 causes, based on the current enable signal EnDfe, the circuit for outputting the second signal pair to be in the non-operating state, so as to reduce the power consumption of the data receiving circuit 100.

In addition, in other embodiments, the level of the first reference signal VR+ may also be less than the level of the second reference signal VR−.

In some embodiments, referring to FIG. 3, the sampling clock signal clkN includes a first sampling clock signal clkN1 and a second sampling clock signal clkN2. The first amplification circuit 101 may include: a first comparison circuit 111, a clock generation circuit 131, and a second comparison circuit 121. The first comparison circuit 111 has a first node net1 and a second node net2, and is configured to receive the data signal DQ and the first reference signal VR+, perform the first comparison in response to the first sampling clock signal clkN1, and output the first signal Sn+ and the second signal Sp+ through the first node net1 and the second node net2 respectively. The clock generation circuit 131 is configured to receive the enable signal EnDfe and an original sampling clock signal clk, and output the second sampling clock signal clkN2. A phase of the second sampling clock signal clkN2 is opposite to a phase of the original sampling clock signal clk during a period in which the enable signal EnDfe is at the first level. The second sampling clock signal clkN2 is a logic high-level signal during a period in which the enable signal EnDfe is at the second level. The second comparison circuit 121 has a third node net3 and a fourth node net4, and is configured to receive the data signal DQ and the second reference signal VR−, perform the second comparison in response to the second sampling clock signal clkN2 during a period in which the enable signal EnDfe is at the first level, output the third signal Sn− and the fourth signal Sp− through the third node net3 and the fourth node net4 respectively, turn on a connection path between the third node net3 and ground during a period in which the enable signal EnDfe is at the second level, and turn on a connection path between the fourth node net4 and ground.

It may be understood that, in some embodiments, regardless of whether the impact of the intersymbol interference on the data receiving circuit 100 is required to be considered, the first comparison circuit 111 may perform the first comparison in response to the first sampling clock signal clkN1, and output the first signal Sn+ and the second signal Sp+ through the first node net1 and the second node net2 respectively. However, for the second comparison circuit 121, the second comparison circuit 121 determines, based on the received second sampling clock signal clkN2, whether to perform the second comparison. For example, when the impact of the intersymbol interference on the data receiving circuit 100 is required to be reduced, the enable signal EnDfe is set to be at the first level, the phase of the current second sampling clock signal clkN2 is opposite to the phase of the original sampling clock signal clk, so that the second comparison circuit 121 may perform the second comparison in response to the second sampling clock signal clkN2. When the impact of the intersymbol interference on the data receiving circuit 100 is not required to be considered, the enable signal EnDfe is set to be at the second level, and the current second sampling clock signal clkN2 is a logic high-level signal. The second comparison circuit 121 turns on the connection path between the third node net3 and ground and turns on the connection path between the fourth node net4 and ground by means of the logic high-level signal, so that the second comparison circuit 121 outputs the third signal Sn− and the fourth signal Sp− respectively through the third node net3 and the fourth node net4 respectively, both of which are logic low-level signals. There is no level variance between the third signal Sn− and the fourth signal Sp−. In addition, in this case, the current in the second comparison circuit 121 is almost 0, thus facilitating reducing the overall power consumption of the data receiving circuit 100.

In some embodiments, referring to FIG. 3 to FIG. 5, the first comparison circuit 111 may include: a first current source 1111, a first comparator 1112, and a first reset circuit 1113. The first current source 1111 is connected between a power node Vcc and a fifth node net5, and configured to supply a current to the fifth node net5 in response to the first sampling clock signal clkN1. The first comparator 1112 is connected to the first node net1, the second node net2 and the fifth node net5, and configured to receive the data signal DQ and the first reference signal VR+, perform the first comparison when the first current source 1111 supplies the current to the fifth node net5, and output the first signal Sn+ and the second signal Sp+. The first reset circuit 1113 is connected to the first node net1 and the second node net2, and configured to reset the first node net1 and the second node net2 in response to the first sampling clock signal clkN1.

The second comparison circuit 121 may include: a second current source 1211, a second comparator 1212, and a second reset circuit 1213. The second current source 1211 is connected between the power node Vcc and a sixth node net6, and configured to supply a current to the sixth node net6 in response to the second sampling clock signal clkN2. The second comparator 1212 is connected to the third node net3, the fourth node net4 and the sixth node net6, and configured to receive the data signal DQ and the second reference signal VR−, perform the second comparison when the second current source 1211 supplies the current to the sixth node net6, and output the third signal Sn− and the fourth signal Sp−. The second reset circuit 1213 is connected between the third node net3 and the fourth node net4, and configured to reset the third node net3 and the fourth node net4 in response to the second sampling clock signal clkN2.

It may be understood that, based on a voltage difference between the data signal DQ and the first reference signal VR+, the first comparator 1112 may control a difference between the current supplied to the first node net1 and the current supplied to the second node net2, so as to output the first signal Sn+ and the second signal Sp+. The second comparator 1212 may control a difference between the current supplied to the third node net3 and the current supplied to the fourth node net4, based on a voltage difference between the data signal DQ and the second reference signal VR−, so as to output the third signal Sn− and the fourth signal Sp−. In addition, after the data receiving circuit 100 completes one reception of the data signal DQ, the first reference signal VR+ and the second reference signal VR− and one output of the first output signal Vout and the second output signal VoutN, the levels at the first node net1 and the second node net2 may restore to their respective initial values through the first reset circuit 1113, and the levels at the third node net3 and the fourth node net4 may restore to their respective initial values through the second reset circuit 1213, so that the data receiving circuit 100 can perform next data receiving and processing subsequently.

In some embodiments, a circuit structure of the first current source 1111 is the same as a circuit structure of the second current source 1211. A circuit structure of the first comparator 1112 is the same as a circuit structure of the second comparator 1212. In this way, the difference between the first signal pair outputted by the first comparison circuit 111 and the second signal pair outputted by the second comparison circuit 121 is mainly affected by the first reference signal VR+ and the second reference signal VR−, so that the data receiving circuit 100 can further reduce the impact of the intersymbol interference of the received data signal DQ on the data receiving circuit 100 based on the first reference signal VR+ and the second reference signal VR−. Therefore, the accuracy of the first output signal Vout and the second output signal VoutN outputted by the second amplification circuit 102 can be further enhanced.

In some embodiments, referring to FIG. 5, the first current source 1111 may include: a first PMOS transistor MP1, connected between the power node Vcc and the fifth node net5. A gate of the first PMOS transistor MP1 is configured to receive the first sampling clock signal clkN1. The second current source 1211 may include a second PMOS transistor MP2, connected between the power node Vcc and the sixth node net6. A gate of the second PMOS transistor MP2 is configured to receive the second sampling clock signal clkN2.

Therefore, when the first sampling clock signal clkN1 is at a low level, the gate of the first PMOS transistor MP1 is turned on by receiving the first sampling clock signal clkN1; the current is supplied to the fifth node net5 to cause the first comparator 1112 to be in an operating state. That is to say, the first comparison is performed on the received data signal DQ and the first reference signal VR+. When the second sampling clock signal clkN2 is at a low level, the gate of the second PMOS transistor MP2 is turned on by receiving the second sampling clock signal clkN2; the current is supplied to the sixth node net6 to cause the second comparator 1212 to be in an operating state; and then the second comparison is performed on the received data signal DQ and the second reference signal VR−.

In an example, the phase of the first sampling clock signal clkN1 is opposite to the phase of the original sampling clock signal clk. When the impact of the intersymbol interference on the data receiving circuit is required to be reduced, the enable signal EnDfe is set at the first level, and the phase of the second sampling clock signal clkN2 is also opposite to the phase of the original sampling clock signal clk, so that the phase of the first sampling clock signal clkN1 and the phase of the second sampling clock signal clkN2 are synchronous, and the first PMOS transistor MP1 and the second PMOS transistor MP2 are turned on at the same time, to cause the first comparator 1112 to perform the first comparison and cause the second comparator 1212 to perform the second comparison. Then, the first signal pair and the second signal pair outputted by the first amplification circuit 101 are both valid. That is to say, there is a level difference between the first signal pair and the second signal pair. Subsequently, the second amplification circuit 102 may selectively receive the first signal pair or the second signal pair based on the varying feedback signal fb, to reduce the impact of the intersymbol interference of the received data signal DQ on the data receiving circuit 100. In addition, when the impact of the intersymbol interference on the data receiving circuit 100 is not required to be considered, the enable signal EnDfe is set to be at the second level, the second sampling clock signal clkN2 is the logic high-level signal, and the second PMOS transistor MP2 is always turned off, so that the current in the second comparator 1212 is almost 0, so as to reduce the power consumption of the data receiving circuit 100. Furthermore, at this time, the current second comparator 1212 cannot perform the second comparison, so that the valid second signal pair cannot be outputted. At this time, the first sampling clock signal clkN1 is a clock signal, and the first PMOS transistor MP1 may start to be turned on based on a falling edge of the clock signal, so as to cause the first comparator 1112 to perform the first comparison to output the valid first signal pair. Therefore, the entire data receiving circuit 100 may normally operate.

In some embodiments, referring to FIG. 5, the first comparator 1112 may include: a third PMOS transistor MP3 and a fourth PMOS transistor MP4. The third PMOS transistor MP3 is connected between the first node net1 and the fifth node net5, where a gate of the third PMOS transistor MP3 is configured to receive the data signal DQ. The fourth PMOS transistor MP4 is connected between the second node net2 and the fifth node net5, where a gate of the fourth PMOS transistor MP4 is configured to receive the first reference signal VR+. The second comparator 1212 may include: a fifth PMOS transistor MP5 and a sixth PMOS transistor MP6. The fifth PMOS transistor MP5 is connected between the third node net3 and the sixth node net6, where a gate of the fifth PMOS transistor MP5 is configured to receive the data signal DQ. The sixth PMOS transistor MP6 is connected between the fourth node net4 and the sixth node net6, where a gate of the sixth PMOS transistor MP6 is configured to receive the second reference signal VR.

It is to be noted that, for the first comparator 1112, variance of the level of the data signal DQ and variance of the level of the first reference signal VR+ are asynchronous, so that a turning-on moment of the third PMOS transistor MP3 receiving the data signal DQ is different from a turning-on moment of the fourth PMOS transistor MP4 receiving the first reference signal VR+, and at the same moment, a turning-on degree of the third PMOS transistor MP3 is different from a turning-on degree of the fourth PMOS transistor MP4. It may be understood that, since the turning-on degree of the third PMOS transistor MP3 is different from the turning-on degree of the fourth PMOS transistor MP4, the abilities of the third PMOS transistor MP3 and the fourth PMOS transistor MP4 for shunting the current at the fifth node net5 are also different, so that a voltage at the first node net1 is different from a voltage at the second node net2, which facilitates output of the first signal Sn+ and the second signal Sp+ as the first signal pair with a larger level difference.

For the second comparator 1212, variance of the level of the data signal DQ and variance of the level of the second reference signal VR− are asynchronous, so that a turning-on moment of the fifth PMOS transistor MP5 receiving the data signal DQ is different from a turning-on moment of the sixth PMOS transistor MP6 receiving the second reference signal VR−, and at the same moment, a turning-on degree of the fifth PMOS transistor MP5 is different from a turning-on degree of the sixth PMOS transistor MP6. It may be understood that, since the turning-on degree of the fifth PMOS transistor MP5 is different from the turning-on degree of the sixth PMOS transistor MP6, the abilities of the fifth PMOS transistor MP5 and the sixth PMOS transistor MP6 for shunting the current at the sixth node net6 are also different, so that a voltage at the third node net3 is different from a voltage at the fourth node net4, which facilitates the output of the third signal Sn− and the fourth signal Sp− as the second signal pair having a larger level difference.

In an example, when the level of the data signal DQ is lower than the level of the first reference signal VR+, the turning-on degree of the third PMOS transistor MP3 is greater than the turning-on degree of the fourth PMOS transistor MP4, to cause more current at the fifth node net5 to flow into a path where the third PMOS transistor MP3 is located, so that the current at the first node net1 is greater than the current at the second node net2, so as to further achieve a high level of the first signal Sn+ outputted by the first node net1 and a low level of the second signal Sp+ outputted by the second node net2. When the level of the data signal DQ is lower than the level of the second reference signal VR−, the turning-on degree of the fifth PMOS transistor MP5 is greater than the turning-on degree of the sixth PMOS transistor MP6, to cause more current at the sixth node net6 to flow into a path where the fifth PMOS transistor MP5 is located, so that the current at the third node net3 is greater than the current at the fourth node net4, so as to further achieve a high level of the third signal Sn− outputted by the third node net3 and a low level of the fourth signal Sp− outputted by the fourth node net4.

Likewise, when the level of the data signal DQ is higher than the level of the first reference signal VR+, the turning-on degree of the third PMOS transistor MP3 is less than the turning-on degree of the fourth PMOS transistor MP4, so that the level of the first signal Sn+ outputted by the first node net1 is low, and the level of the second signal Sp+ outputted by the second node net2 is high. When the level of the data signal DQ is higher than the level of the second reference signal VR−, a turning-on degree of the fifth PMOS transistor MP5 is less than a turning-on degree of the sixth PMOS transistor MP6, so that the level of the third signal Sn− outputted by the third node net3 is low, and the level of the fourth signal Sp− outputted by the fourth node net4 is high.

In some embodiments, referring to FIG. 5, the first reset circuit 1113 may include a first NMOS transistor MN1 and a second NMOS transistor MN2. The first NMOS transistor MN1 is connected between the first node net1 and ground, where a gate of the first NMOS transistor MN1 is configured to receive the first sampling clock signal clkN1. The second NMOS transistor MN2 is connected between the second node net2 and ground, where a gate of the second NMOS transistor MN2 is configured to receive the first sampling clock signal clkN1. The second reset circuit 1213 may include a third NMOS transistor MN3 and a fourth NMOS transistor MN4. The third NMOS transistor MN3 is connected between the third node net3 and ground, where a gate of the third NMOS transistor MN3 is configured to receive the second sampling clock signal clkN2. The fourth NMOS transistor MN4 is connected between the fourth node net4 and ground, where a gate of the fourth NMOS transistor MN4 is configured to receive the second sampling clock signal clkN2.

In an example, the phase of the first sampling clock signal clkN1 is opposite to the phase of the original sampling clock signal clk. When the impact of the intersymbol interference on the data receiving circuit is required to be reduced, the enable signal EnDfe is set to be at the first level, and the phase of the second sampling clock signal clkN2 is also opposite to the phase of the original sampling clock signal clk. At this time, the phase of the first sampling clock signal clkN1 and the phase of the second sampling clock signal clkN2 are synchronous. If both the first sampling clock signal clkN1 and the second sampling clock signal clkN2 are at a low level, the first PMOS transistor MP1 and the second PMOS transistor MP2 are turned on. At this time, the first NMOS transistor MN1, the second NMOS transistor MN2, the third NMOS transistor MN3 and the fourth NMOS transistor MN4 are all turned off, to guarantee that the first signal pair and the second signal pair outputted by the first amplification circuit 101 are valid. In addition, the first NMOS transistor MN1 and the second NMOS transistor MN2 may be used as loads of the first comparator 1112, to increase the amplification gain of the first comparator 1112. The third NMOS transistor MN3 and the fourth NMOS transistor MN4 may be used as loads of the second comparator 1212, to increase the amplification gain of the second comparator 1212. If both the first sampling clock signal clkN1 and the second sampling clock signal clkN2 are at a high level, the first PMOS transistor MP1 and the second PMOS transistor MP2 are turned off, so that there is no current passing through the first comparator 1112 and the second comparator 1212. At this time, the first NMOS transistor MN1, the second NMOS transistor MN2, the third NMOS transistor MN3 and the fourth NMOS transistor MN4 are all turned on, to pull down the voltage at the first node net1, the voltage at the second node net2, the voltage at the third node net3, and the voltage at the fourth node net4. Therefore, the first node net1, the second node net2, the third node net3, and the fourth node net4 are reset. In this way, the data receiving circuit 100 can perform the next data receiving and processing subsequently.

In addition, when the impact of the intersymbol interference on the data receiving circuit 100 is not required to be considered, the enable signal EnDfe is set to be at the second level, the second sampling clock signal clkN2 is the logic high-level signal, and the second PMOS transistor MP2 is always turned off. At this time, the third NMOS transistor MN3 and the fourth NMOS transistor MN4 are both turned on, to pull down the connection path between the third node net3 and ground, and the connection path between the fourth node net4 and ground is turned on, so that the third node net3 and the fourth node net4 can be reset. At this time, the current in the second comparator 1212 is almost 0, so that the power consumption of the data receiving circuit 100 can be reduced. At this time, if the first sampling clock signal clkN1 is at a low level, the first PMOS transistor MP1 is turned on, and the first NMOS transistor MN1 and the second NMOS transistor MN2 are turned off, to guarantee the first comparison circuit 111 to perform the first comparison, so as to output the valid first signal pair, so that the second amplification circuit 102 may keep receiving the first signal pair subsequently. Alternatively, if the first sampling clock signal clkN1 is at a high level, the first PMOS transistor MP1 is turned off, and the first NMOS transistor MN1 and the second NMOS transistor MN2 are turned on to pull down a voltage at the first node net1 and a voltage at the second node net2, the first node net1 and the second node net2 are reset. Therefore, the data receiving circuit 100 can perform the next data receiving and processing subsequently.

In some embodiments, continuously referring to FIG. 5, the clock generation circuit 131 may include: a first NAND gate circuit 1311. One input of the first NAND gate circuit 1311 is configured to receive the original sampling clock signal, the other input of the first NAND gate circuit 1311 is connected to the power node Vcc; and an output of the first NAND gate circuit 1311 is configured to output the first sampling clock signal clkN1.

It may be understood that, since one input of the first NAND gate circuit 1311 is connected to the power node Vcc, the input is configured to receive a high level. At this time, if the original sampling clock signal clk received by the other input of the first NAND gate circuit 1311 is at the high level, the first sampling clock signal clkN1 is at the low level. If the original sampling clock signal clk received by the other input of the first NAND gate circuit 1311 is at the low level, the first sampling clock signal clkN1 is at the high level. In this way, the phase of the first sampling clock signal clkN1 is opposite to the phase of the original sampling clock signal clk. Therefore, when the impact of the intersymbol interference on the data receiving circuit is required to be reduced, the phase of the first sampling clock signal clkN1 and the phase of the second sampling clock signal clkN2 are synchronous, so that the first amplification circuit 101 may simultaneously perform the first comparison and the second comparison.

In some embodiments, continuously referring to FIG. 5, the clock generation circuit 131 may include: a second NAND gate circuit 1312. One input of the second NAND gate circuit 1312 is configured to receive the original sampling clock signal clk, and the other input of the second NAND gate circuit 1312 is configured to receive the enable signal EnDfe; and an output of the second NAND gate circuit 1312 is configured to output the second sampling clock signal clkN2.

It is to be noted that, in an example, the period in which the enable signal EnDfe is at the first level refers to a level range in which the second NAND gate circuit 1312 determines the enable signal EnDfe to be at a logic level 1, that is, the high level. The second level of the enable signal EnDfe refers to a level range in which the second NAND gate circuit 1312 determines the enable signal EnDfe to be at a logic level 0, that is, the low level.

It may be understood that, the phase of the first sampling clock signal clkN1 is opposite to the phase of the original sampling clock signal clk; when the impact of the intersymbol interference on the data receiving circuit is required to be reduced, the enable signal EnDfe is set to be at the high level. If the original sampling clock signal clk is at the high level, the two inputs of the second NAND gate circuit 1312 are configured to receive the high level, so that the second sampling clock signal clkN2 outputted by the output is at the low level. At this time, the first sampling clock signal clkN1 is also at the low level, so that the first amplification circuit 101 may simultaneously perform the first comparison and the second comparison, and the second amplification circuit 102 may selectively receive the first signal pair or the second signal pair based on the varying feedback signal fb subsequently, so as to reduce the impact of the intersymbol interference of the received data signal DQ on the data receiving circuit 100. If the original sampling clock signal clk is at the low level, the second sampling clock signal clkN2 outputted by the second NAND gate circuit 1312 is at the high level. At this time, the first sampling clock signal clkN1 is also at the high level, so that the first comparator 1112 and the second comparator 1212 are in a non-operating state. In this way, the levels at the first node net1 and the second node net2 may restore to their respective initial values through the first reset circuit 1113, and the levels at the third node net3 and the fourth node net4 restore to their respective initial values through the second reset circuit 1213, so that the data receiving circuit 100 can perform the next data receiving and processing subsequently.

When the impact of the intersymbol interference on the data receiving circuit 100 is not required to be considered, the enable signal EnDfe is set to be at the low level. At this time, regardless of the original sampling clock signal clk being at the high level or at the low level, the second sampling clock signal clkN2 outputted by the second NAND gate circuit 1312 is at the high level. Therefore, regardless of the first sampling clock signal clkN1 being at the high level or at the low level, that is, regardless of whether the first comparator 1112 performs the first comparison, in the second comparison circuit 121, the connection path between the third node net3 and ground and the connection path between the fourth node net4 and ground are turned on, so that the third signal Sn– and the fourth signal Sp– outputted by the second comparison circuit 121 using the third node net3 and the fourth node net4 respectively are logic low-level signals. There is no level difference between the third signal Sn– and the fourth signal Sp–.

It is to be noted that, it is merely an example that both the first NAND gate circuit 1311 and the second NAND gate circuit 1312 only include one NAND gate in FIG. 5. In the practical application, specific structures of the first NAND gate circuit 1311 and the second NAND gate circuit 1312 are not limited, so that circuits that can realize NAND logic may be the first NAND gate circuit 1311 and the second NAND gate circuit 1312.

In some embodiments, referring to FIG. 4, the second amplification circuit 102 may include: a decision equalization enable circuit 152, a first input circuit 112, a second input circuit 122, and a latch 132. The decision equalization enable circuit 152 is configured to receive the feedback signal fb (referring to FIG. 1) and the enable signal EnDfe. The first input circuit 112 is connected to a seventh node net7 and an eighth node net8, and configured to be connected to the decision equalization enable circuit 152, be turned on under control of the decision equalization enable circuit 152 to receive the first signal pair for third comparison, and provide signals to the seventh node net7 and the eighth node net8 respectively as a result of the third comparison. The second input circuit 122 is connected to the seventh node net7 and the eighth node net8, and configured to be connected to the decision equalization enable circuit 152, be turned on under control of the decision equalization enable circuit 152 to receive the second signal pair for fourth comparison, and provide the signal to the seventh node net7 and the eighth node net8 respectively as a result of the fourth comparison, where the first input circuit 112 and the second input circuit 122 are alternatively turned on under control of the decision equalization enable circuit 152. The latch 132 is connected to the seventh node net7 and the eighth node net8, and configured to amplify and latch the signal of the seventh node net7 and the signal of the eighth node net8, and output the first output signal Vout and the second output signal VoutN through first output node net9 and a second output node net10 respectively.

It may be understood that, when the impact of the intersymbol interference on the data receiving circuit is required to be reduced, the enable signal EnDfe is set to be at the first level, the first signal pair and the second signal pair outputted by the first amplification circuit 101 are valid, and the first input circuit 112 and the second input circuit 122 are controlled by the decision equalization enable circuit 152. At this time, the input circuit that is turned on receives the signal pair having a larger signal level difference in the received signal pairs, so that the second amplification circuit 102 receives one of the first signal pair and the second signal pair that has a larger level difference, to enhance the accuracy of the first output signal Vout and the second output signal VoutN outputted by the second amplification circuit 102. When the impact of the intersymbol interference on the data receiving circuit 100 is not required to be considered, the enable signal EnDfe is set to be at the second level, and the first input circuit 112 and the second input circuit 122 are not controlled by the decision equalization enable circuit 152, so that the first input circuit 112 is turned on or off under control of the received first signal pair, and the second input circuit 122 is turned on or off under control of the received second signal pair.

In addition, the decision equalization enable circuit 152 is integrated in the second amplification circuit 102, so that an overall layout area of the data receiving circuit 100 can be further reduced.

The latch 132 is configured to output a high level signal to the first output node net9 and output a low level signal to the second output node net10 according to the signal of the seventh node net7 and the signal of the eighth node net8, or to output the low level signal to the first output node net9 and output the high level signal to the second output node net10.

In some embodiments, continuously referring to FIG. 4, the feedback signal fb (referring to FIG. 1) may include a differential first feedback signal fbp and a second feedback signal fbn. The decision equalization enable circuit 152 may include a first enable circuit 1521 and a second enable circuit 1522. The first enable circuit 1521 is connected between ground and the first input circuit 112 and between ground and the second input circuit 122, and configured to receive the enable signal EnDfe, the first feedback signal fbp and the second feedback signal fbn, so as to control one of the first input circuit 112 and the second input circuit 122 to be connected to ground. The second enable circuit 1522 is connected between ground and the first input circuit 112 and between ground and the second input circuit 122, and configured to receive a complementary enable signal EnDfeN, so as to control the first input circuit 112 to be connected to ground. A level of the complementary enable signal EnDfeN is opposite to a level of the enable signal EnDfe. The first enable circuit 1521 and the second enable circuit 1522 are alternatively selected to be turned on.

It is to be noted that, that the level of the complementary enable signal EnDfeN is opposite to the level of the enable signal EnDfe means that, when one of the complementary enable signal EnDfeN and the enable signal EnDfe is at the high level, the other one is at the low level.

It may be understood that, when the impact of the intersymbol interference on the data receiving circuit is required to be reduced, the enable signal EnDfe is set to be at the first level, and the complementary enable signal EnDfeN is set to be at the second level. At this time, the first enable circuit 1521 turns on the first input circuit 112 or the second input circuit 122 based on one of the first feedback signal fbp and the second feedback signal fbn, so that the second amplification circuit 102 receives one of the first signal pair and the second signal pair that has a larger level difference. At this time, the second enable circuit 1522 is turned off. When the impact of the intersymbol interference on the data receiving circuit 100 is not required to be considered, the enable signal EnDfe is set to be at the second level, the complementary enable signal EnDfeN is set to be at the first level, and the second enable circuit 1522 is turned on, so that the first input circuit 112 is turned on or off under control of the received first signal pair. At this time, the third signal Sn– and the fourth signal Sp– outputted by the second comparison circuit 121 are logic low-level signals, so that the second input circuit 122 receiving the third signal Sn– and the fourth signal Sp– is turned off, and at this time, the first enable circuit 1521 is also turned off, so as to further reduce the power consumption of the data receiving circuit 100.

It is to be noted that, in an example, the period in which the complementary enable signal EnDfeN is at the first level refers to a level range in which the second enable circuit 1522 determines the complementary enable signal EnDfeN to be at the logic level 1, that is, the high level. The period in which the complementary enable signal EnDfeN is at the second level refers to a level range in which the second enable circuit 1522 determines the complementary enable signal EnDfeN to be at the logic level 0, that is, the low level. In addition, the decision equalization enable circuit 152 may provide the complementary enable signal EnDfeN to itself based on the received enable signal EnDfe. In the practical application, the complementary enable signal EnDfeN may also be provided to the decision equalization enable circuit 152 by other circuits.

In some embodiments, referring to FIG. 6, the first input circuit 112 may include: a fifth NMOS transistor MN5 and a sixth NMOS transistor MN6. A drain of the fifth NMOS transistor MN5 is connected to the seventh node net7, a source of the fifth NMOS transistor MN5 is connected to the first enable circuit 1521 and the second enable circuit 1522, and a gate of the fifth NMOS transistor MN5 is configured to receive the first signal Sn+. A drain of the sixth NMOS transistor MN6 is connected to the eighth node net8; a source of the sixth NMOS transistor MN6 is connected to the first enable circuit 1521 and the second enable circuit 1522; and a gate of the sixth NMOS transistor MN6 is configured to receive the second signal Sp+. The second input circuit 122 may include a seventh NMOS transistor MN7 and an eighth NMOS transistor MN8. A drain of the seventh NMOS transistor MN7 is connected to the seventh node net7, a source of the seventh NMOS transistor MN7 is connected to the first enable circuit 1521 and the second enable circuit 1522, and a gate of the seventh NMOS transistor MN7 is configured to receive the third signal Sn–. A drain of the eighth NMOS transistor MN8 is connected to the eighth node net8; a source of the eighth NMOS transistor MN8 is connected to the first enable circuit 1521 and the second enable circuit 1522; and a gate of the eighth NMOS transistor MN8 is configured to receive the fourth signal Sp–.

In an example, when the first input circuit 112 is turned on under control of the decision equalization enable circuit 152, and if the level of the data signal DQ is higher than the level of the first reference signal VR+, the level of the first signal Sn+ is low, and the level of the second signal Sp+ is high, the gate of the fifth NMOS transistor MN5 receives the first signal Sn+, and the gate of the sixth NMOS transistor MN6 receives the second signal Sp+, so that a turning-on degree of the sixth NMOS transistor MN6 is greater than a turning-on degree of the fifth NMOS transistor MN5, and the voltage at the eighth node net8 is less than the voltage at the seventh node net7. Likewise, if the level of the data signal DQ is lower than the level of the first reference signal VR+, the level of the first signal Sn+ is high, and the level of the second signal Sp+ is low, the turning-on degree of the fifth NMOS transistor MN5 is greater than the turning-on degree of the sixth NMOS transistor MN6, and the voltage at the seventh node net7 is less than the voltage at the eighth node net8.

In another example, when the second input circuit 122 is turned on under control of the decision equalization enable circuit 152, and if the level of the data signal DQ is higher than the level of the second reference signal VR–, the level of the third signal Sn– is low, and the level of the fourth signal Sp– is high, the gate of the seventh NMOS transistor MN7 receives the third signal Sn–, and the gate of the eighth NMOS transistor MN8 receives the fourth signal Sp–, so that a turning-on degree of the eighth NMOS transistor MN8 is greater than a turning-on degree of the seventh NMOS transistor MN7, and the voltage at the eighth node net8 is less than the voltage at the seventh node net7. Likewise, if the level of the data signal DQ is lower than the level of the second reference signal VR–, the level of the third signal Sn– is high, and the level of the fourth signal Sp– is low, the turning-on degree of the seventh NMOS transistor MN7 is greater than the turning-on degree of the eighth NMOS transistor MN8, and the voltage at the seventh node net7 is less than the voltage at the eighth node net8.

In some embodiments, continuously referring to FIG. 6, the first enable circuit 1521 may include a ninth NMOS transistor MN9, a tenth NMOS transistor MN10, an eleventh NMOS transistor MN11 and a twelfth NMOS transistor MN12. A drain of the ninth NMOS transistor MN9 is connected to the source of the fifth NMOS transistor MN5 and the source of the sixth NMOS transistor MN6, a source of the ninth NMOS transistor MN9 is connected to a drain of the tenth NMOS transistor MN10, a gate of the ninth NMOS transistor MN9 is configured to receive the first feedback signal fbp, a gate of the tenth NMOS transistor MN10 is configured to receive the enable signal EnDfe, and a source of the tenth NMOS transistor MN10 is connected to ground. A drain of the eleventh NMOS transistor MN11 is connected to the source of the seventh NMOS transistor MN7 and the source of the eighth NMOS transistor MN8; a source of the eleventh NMOS transistor MN11 is connected to a drain of the twelfth NMOS transistor MN12; a gate of the eleventh NMOS transistor MN11 is configured to receive the second feedback signal fbn; a gate of the twelfth NMOS transistor MN12 is configured to receive the enable signal EnDfe; and a source of the twelfth NMOS transistor MN12 is connected to ground.

It is to be noted that, that the first enable circuit 1521 controlling the first input circuit 112 to be connected to ground means that, the first enable circuit 1521 controls the turning on of the ninth NMOS transistor MN9 and the tenth NMOS transistor MN10 based on the enable signal EnDfe and the first feedback signal fbp, so that the first input circuit 112 may be turned on upon receiving the first signal pair, so as to be connected to ground. That the first enable circuit 1521 controls the second input circuit 122 to be connected to ground means that, the first enable circuit 1521 controls the turning on of the eleventh NMOS transistor MN11 and the twelfth NMOS transistor MN12 based on the enable signal EnDfe and the second feedback signal fbn, so that the second input circuit 122 may be turned on upon receiving the second signal pair, so as to be connected to ground.

In some embodiments, continuously referring to FIG. 6, the second enable circuit 1522 may include: a thirteenth NMOS transistor MN13 and a fourteenth NMOS transistor MN14. A drain of the thirteenth NMOS transistor MN13 is connected to the source of the fifth NMOS transistor MN5 and the source of the sixth NMOS transistor MN6, a source of the thirteenth NMOS transistor MN13 is connected ground, and a gate of the thirteenth NMOS transistor MN13 is configured to receive the complementary enable signal EnDfeN. A drain of the fourteenth NMOS transistor MN14 is connected to the source of the seventh NMOS transistor MN7 and the source of the eighth NMOS transistor MN8; a source of the fourteenth NMOS transistor MN14 is connected ground; and a gate of the fourteenth NMOS transistor MN14 is configured to receive the complementary enable signal EnDfeN.

It is to be noted that, when a plurality of data receiving circuits 100 are cascaded, obtaining the feedback signal fb based on the previously received data means that, the first output signal Vout and the second output signal VoutN outputted by the data receiving circuit 100 at a previous stage are used as the feedback signals fb of the data receiving circuit 100 at a subsequent stage; and the first output signal Vout and the second output signal VoutN outputted by the data receiving circuit 100 at the last stage are used as the feedback signals fb of the data receiving circuit 100 at the first stage. Specifically, the first output signal Vout outputted by the first output node net9 of the data receiving circuit 100 at the previous stage is used as the first feedback signal fbp of the data receiving circuit 100 at the subsequent stage. The second output signal VoutN outputted by the second output node net10 of the data receiving circuit 100 at the previous stage is used as the second feedback signal fbn of the data receiving circuit 100 at the subsequent stage. The first output signal Vout outputted by the first output node net9 of the data receiving circuit 100 at the last stage is used as the first feedback signal fbp of the data receiving circuit 100 at the first stage. The second output signal VoutN outputted by the second output node net10 of the data receiving circuit 100 at the last stage is used as the second feedback signal fbn of the data receiving circuit 100 at the first stage.

It may be understood that, if the first output signal Vout outputted by the first output node net9 of the data receiving circuit 100 at the previous stage is at the high level and the second output signal VoutN outputted by the second output node net10 is at the low level, the first feedback signal fbp received by the data receiving circuit 100 at the subsequent stage is at the high level, and the second feedback signal fbn is at the low level. At this time, the ninth NMOS transistor MN9 is turned on, and the eleventh NMOS transistor MN11 is turned off. When the impact of the intersymbol interference on the data receiving circuit is required to be reduced, the enable signal EnDfe is set to be at the logic level 1, and the complementary enable signal EnDfeN is set to be at the logic level 0, then the tenth NMOS transistor MN10 is turned on, so that the first input circuit 112 is connected to ground, to provide signals to the seventh node net7 and the eighth node net8 as a result of the third comparison. At this time, the thirteenth NMOS transistor MN13 and the fourteenth NMOS transistor MN14 are disconnected.

If in the data receiving circuit 100 at the previous stage, the first output signal Vout outputted by the first output node net9 is at the low level and the second output signal VoutN outputted by the second output node net10 is at the high level, the first feedback signal fbp received by the data receiving circuit 100 at the subsequent stage is at the low level, and the second feedback signal fbn received by the data receiving circuit 100 at the subsequent stage is at the high level. At this time, the ninth NMOS transistor MN9 is turned off, and the eleventh NMOS transistor MN11 is turned on. When the impact of the intersymbol interference on the data receiving circuit is required to be reduced, the enable signal EnDfe is set to be at the logic level 1, the complementary enable signal EnDfeN is set to be at the logic level 0, then the twelfth NMOS transistor MN12 is turned on, so that the second input circuit 122 is connected to ground, to provide signals to the seventh node net7 and the eighth node net8 as a result of the fourth comparison. At this time, the thirteenth NMOS transistor MN13 and the fourteenth NMOS transistor MN14 are disconnected.

When the impact of the intersymbol interference on the data receiving circuit 100 is not required to be considered, the enable signal EnDfe is set to be at the logic level 0, and the complementary enable signal EnDfeN is set to be at the logic level 1, then the tenth NMOS transistor MN10 and the twelfth NMOS transistor MN12 are turned off, that is, the first enable circuit 1521 is turned off, and the thirteenth NMOS transistor MN13 and the fourteenth NMOS transistor MN14 are turned on, so that the first input circuit 112 is turned on or off under control of the received first signal Sn+ and the second signal Sp+. For example, when the first comparison circuit 111 performs the first comparison to output the first signal Sn+ and the second signal Sp+ that are the differential signals, the turning-on degrees of the fifth NMOS transistor MN5 and the sixth NMOS transistor MN6 are different due to different levels of the received signals, so as to guarantee the accuracy of the first output signal Vout and the second output signal VoutN. At this time, the third signal Sn− and the fourth signal Sp− outputted by the second comparison circuit 121 are the logic low-level signals, so that the seventh NMOS transistor MN7 receiving the third signal Sn− and the eighth NMOS transistor MN8 receiving the fourth signal Sp− are turned off, which facilitates reducing the power consumption of the data receiving circuit 100.

In some embodiments, continuously referring to FIG. 6, the latch 132 may include: a fifteenth NMOS transistor MN15, a seventh PMOS transistor MP7, a sixteenth NMOS transistor MN16 and an eighth PMOS transistor MP8. A gate of the fifteenth NMOS transistor MN15 and a gate of the seventh PMOS transistor MP7 are connected to the second output node net10, a source of the fifteenth NMOS transistor MN15 is connected to the seventh node net7, a drain of the fifteenth NMOS transistor MN15 and a drain of the seventh PMOS transistor MP7 are connected to the first output node net9, and a source of the seventh PMOS transistor MP7 is connected to a power node Vcc. A gate of the sixteenth NMOS transistor MN16 and a gate of the eighth PMOS transistor MP8 are connected to the first output node net9; a source of the sixteenth NMOS transistor MN16 is connected to the eighth node net8; a drain of the sixteenth NMOS transistor MN16 and a drain of the eighth PMOS transistor MP8 are connected to the second output node net10; and a source of the eighth PMOS transistor MP8 is connected to the power node Vcc.

In an example, if the level of the data signal DQ is higher than the level of the first reference signal VR+, that is, the voltage at the eighth node net8 is less than the voltage at the seventh node net7, the turning-on degree of the sixteenth NMOS transistor MN16 is greater than a turning-on degree of the fifteenth NMOS transistor MN15. The voltage at the second output node net10 is less than the voltage at the first output node net9, so that the turning-on degree of the eighth PMOS transistor MP8 is less than the turning-on degree of the seventh PMOS transistor MP7. Therefore, the latch 132 forms a positive feedback amplification, to further cause the first output signal Vout outputted by the first output node net9 to be at the high level and cause the second output signal VoutN outputted by the second output node net10 to be at the low level. Likewise, if the level of the data signal DQ is lower than the level of the first reference signal VR+, that is, the voltage at the seventh node net7 is less than the voltage at the eighth node net8, the first output signal Vout outputted by the first output node net9 is at the low level, and the second output signal VoutN outputted by the second output node net10 is at the high level. In some embodiments, continuously referring to FIG. 6, the second amplification circuit 102 may further include: a third reset circuit 142, connected between a power node Vcc and an output of the latch 132, and configured to reset the output of the latch 132. In this way, after the data receiving circuit 100 completes one receiving of the data signal DQ, the first reference signal VR+ and the second reference signal VR− and one output of the first output signal Vout and the second output signal VoutN, the levels at the first output node net9 and the second output node net10 may restore to their respective initial values through the third reset circuit 142, so that the data receiving circuit 100 can perform the next data receiving and processing subsequently.

In some embodiments, continuously referring to FIG. 6, the third reset circuit 142 may include: a ninth PMOS transistor MP9 and a tenth PMOS transistor MP10. The ninth PMOS transistor MP9 is connected between the first output node net9 and a power node Vcc, where a gate of the ninth PMOS transistor MP9 is configured to receive the original sampling clock signal clk. The tenth PMOS transistor MP10 is connected between the second output node net10 and the power node Vcc, where a gate of the tenth PMOS transistor MP10 is configured to receive the original sampling clock signal clk.

In an example, the phase of the first sampling clock signal clkN1 is opposite to the phase of the original sampling clock signal clk. Referring to FIG. 5 and FIG. 6, when the impact of the intersymbol interference on the data receiving circuit 100 is required to be reduced, the enable signal EnDfe is set to be at the logic level 1, the complementary enable signal EnDfeN is set to be at the logic level 0, the phase of the second sampling clock signal clkN2 is set to be opposite to the phase of the original sampling clock signal clk. When the original sampling clock signal clk is at the high level, the first sampling clock signal clkN1 and the second sampling clock signal clkN2 are at the low level, so that the first NMOS transistor MN1 and the second NMOS transistor MN2 are turned on, and the first NMOS transistor MN1, the second NMOS transistor MN2, the third NMOS transistor MN3, the fourth NMOS transistor MN4, the ninth PMOS transistor MP9, and the tenth PMOS transistor MP10 are all turned off. When the original sampling clock signal clk is at the low level, the first sampling clock signal clkN1 and the second sampling clock signal clkN2 are at the high level, so that the first PMOS transistor MP1 and the second PMOS transistor MP2 are turned off. At this time, the first NMOS transistor MN1, the second NMOS transistor MN2, the third NMOS transistor MN3 and the fourth NMOS transistor MN4 are all turned on, to pull down the voltage at the first node net1, the voltage at the second node net2, the voltage at the third node net3, and the voltage at the fourth node net4, and therefore, the first node net1, the second node net2, the third node net3, and the fourth node net4 are reset; the ninth PMOS transistor MP9 and the tenth PMOS transistor MP10 are also turned on, to pull up the voltage at the first output node net9 and the voltage at the second output node net10, so as to reset the first output node net9 and the voltage at the second output node net10.

When the impact of the intersymbol interference on the data receiving circuit 100 is not required to be considered, the enable signal EnDfe is set to be at the logic level 0, and the complementary enable signal EnDfeN is set to be at the logic level 1. At this time, regardless of whether the original sampling clock signal clk is at the high level or at the low level, the second sampling clock signal clkN2 is always at the high level, so that the second PMOS transistor MP2 is always turned off, and the third NMOS transistor MN3 and the fourth NMOS transistor MN4 are turned on, so as to reduce the current in the second comparison circuit 121, thereby reducing the power consumption of the data receiving circuit 100.

A specific operating principle of the data receiving circuit 100 provided in an embodiment of the disclosure is described in detail below with reference to FIG. 6 and Table 1.

In an example, when the plurality of data receiving circuits 100 are cascaded, the first output signal Vout outputted by the first output node net9 of the data receiving circuit 100 at the previous stage is used as the first feedback signal fbp of the data receiving circuit 100 at the subsequent stage. The second output signal VoutN outputted by the second output node net10 of the data receiving circuit 100 at the previous stage is used as the second feedback signal fbn of the data receiving circuit 100 at the subsequent stage.

The level of the first reference signal VR+ being greater than the level of the second reference signal VR− is used as an example for description below. When the data signal DQ is at the logic level 1, it represents that the level of the data signal DQ is greater than the level of the first reference signal VR+. When the data signal DQ is at the logic level 0, it represents that the level of the data signal DQ is less than the level of the second reference signal VR−. It is to be noted that, in Table 1, 1 represents a high level, and 0 represents a low level.

When the impact of the intersymbol interference on the data receiving circuit 100 is required to be considered, the enable signal EnDfe is at the high level, and the complementary enable signal EnDfeN is at the low level. At this time, the tenth NMOS transistor MN10 and the twelfth NMOS transistor MN12 are turned on, and the thirteenth NMOS transistor MN13 and the fourteenth NMOS transistor MN14 are turned off.

Referring to Table 1, if the data signal DQ1 received by the data receiving circuit 100 at the previous stage is at the logic level 1, the first output signal Vout outputted by the data receiving circuit 100 at the previous stage, that is, the first feedback signal fbp of the data receiving circuit 100 at the subsequent stage is at the high level, and the second output signal VoutN outputted by the data receiving circuit 100 at the previous stage, that is, the second feedback signal fbn of the data receiving circuit 100 at the subsequent stage is at the low level. At this time, the gate of the ninth NMOS transistor MN9 is turned on upon receiving the first feedback signal fbp, and the gate of the eleventh NMOS transistor MN11 is disconnected upon receiving the second feedback signal fbn. The first input circuit 112 is configured to perform the third comparison on the first signal Sn+ and the second signal Sp+ to provide signals to the seventh node net7 and the eighth node net8. There is no current flowing through the second input circuit 122.

When the data signal DQ1 received by the data receiving circuit 100 at the previous stage is at the logic level 1, the data signal DQ2 received by the data receiving circuit 100 at the subsequent stage is in the following two cases, respectively.

Case I: referring to Table 1, when the data signal DQ2 received by the data receiving circuit 100 at the subsequent stage is at the logic level 0, the level difference between the data signal DQ2 and the data signal DQ1 received by the data receiving circuit 100 at the previous stage is relatively large, so that there is a large intersymbol interference. At this time, the first input circuit 112 in the data receiving circuit 100 at the subsequent stage is turned on. That is to say, the second amplification circuit 102 in the data receiving circuit 100 at the subsequent stage receives the first signal Sn+ and the second signal Sp+. The first signal pair outputted by the first comparison circuit 111 in the data receiving circuit 100 at the subsequent stage is received by the second amplification circuit 102. At this time, in the data receiving circuit 100 at the subsequent stage, the data signal DQ2 is at the logic level 0, a voltage difference between the data signal DQ2 and the first reference signal VR+ is greater than a voltage difference between the data signal DQ2 and the second reference signal VR−, so that the level difference between the signals in the first signal pair processed by the first comparison circuit 111 is larger. At this time, the output accuracy of the first output signal Vout and the second output signal VoutN can be higher when the second amplification circuit 102 receives the first signal pair, thereby achieving the purpose of reducing the impact of the intersymbol interference of the received data signal DQ on the data receiving circuit 100.

Case II: referring to Table 1, when the data signal DQ2 received by the data receiving circuit 100 at the subsequent stage is at the logic level 1, the level difference between the data signal DQ2 and the data signal DQ1 received by the data receiving circuit 100 at the previous stage is relatively small, so that there is small or no intersymbol interference. At this time, the first input circuit 112 in the data receiving circuit 100 at the subsequent stage is turned on, and the first signal pair outputted by the first comparison circuit 111 in the data receiving circuit 100 at the subsequent stage is received by the second amplification circuit 102.

Referring to Table 1, if the data signal DQ1 received by the data receiving circuit 100 at the previous stage is at the logic level 0, the first output signal Vout outputted by the data receiving circuit 100 at the previous stage, that is, the first feedback signal fbp of the data receiving circuit 100 at the subsequent stage is at the low level, and the second output signal VoutN outputted by the data receiving circuit 100 at the previous stage, that is, the second feedback signal fbn of the data receiving circuit 100 at the subsequent stage is at the high level. At this time, the gate of the ninth NMOS transistor MN9 is disconnected upon receiving the first feedback signal fbp, and the gate of the eleventh NMOS transistor MN11 is turned on upon receiving the second feedback signal fbn. The second input circuit 122 is configured to perform the fourth comparison on the third signal Sn− and the fourth signal Sp− to provide signals to the seventh node net7 and the eighth node net8. There is no current flowing through the first input circuit 112.

When the data signal DQ1 received by the data receiving circuit 100 at the previous stage is at the logic level 0, the data signal DQ2 received by the data receiving circuit 100 at the subsequent stage is in the following two cases, respectively.

Case III: referring to Table 1, when the data signal DQ2 received by the data receiving circuit 100 at the subsequent stage is at the logic level 0, the level difference between the data signal DQ2 and the data signal DQ1 received by the data receiving circuit 100 at the previous stage is relatively small, so that there is small or no intersymbol interference. At this time, the second input circuit 122 in the data receiving circuit 100 at the subsequent stage is turned on, and the second signal pair outputted by the second comparison circuit 121 in the data receiving circuit 100 at the subsequent stage is received by the second amplification circuit 102.

Case IV: referring to Table 1, when the data signal DQ2 received by the data receiving circuit 100 at the subsequent stage is at the logic level 1, the level difference between the data signal DQ2 and the data signal DQ1 received by the data receiving circuit 100 at the previous stage is relatively large, so that there is large intersymbol interference. At this time, the second input circuit 122 in the data receiving circuit 100 at the subsequent stage is turned on. That is to say, the second amplification circuit 102 in the data receiving circuit 100 at the subsequent stage receives the third signal Sn− and the fourth signal Sp−. The second signal pair outputted by the second comparison circuit 121 in the data receiving circuit 100 at the subsequent stage is received by the second amplification circuit 102. At this time, in the data receiving circuit 100 at the subsequent stage, the data signal DQ2 is at the logic level 1, a voltage difference between the data signal DQ2 and the second reference signal VR− is greater than a voltage difference between the data signal DQ2 and the first reference signal VR+, so that the level difference between the signals in the second signal pair processed by the second comparison circuit 121 is larger. At this time, the output accuracy of the first output signal Vout and the second output signal VoutN can be higher when the second amplification circuit 102 receives the second signal pair, thereby achieving the purpose of reducing the impact of the intersymbol interference of the received data signal DQ on the data receiving circuit 100.

TABLE 1

| Data signal DQ1 received by data transmission circuit at previous stage | Data signal DQ2 received by data transmission circuit at subsequent stage | First feedback signal fbp received by data transmission circuit at subsequent stage | Second feedback signal fbn received by data transmission circuit at subsequent stage | Signal pair received by second amplification circuit in data transmission circuit at subsequent stage |
|---|---|---|---|---|
| 1 | 0 | 1 | 0 | Sn+, Sp+ |
| 1 | 1 | 1 | 0 | Sn+, Sp+ |
| 0 | 0 | 0 | 1 | Sn−, Sp− |
| 0 | 1 | 0 | 1 | Sn−, Sp− |

When the impact of the intersymbol interference on the data receiving circuit 100 is not required to be considered, the enable signal EnDfe is at the low level, and the complementary enable signal EnDfeN is at the high level. At this time, the tenth NMOS transistor MN10 and the twelfth NMOS transistor MN12 are turned on, and the thirteenth NMOS transistor MN13 and the fourteenth NMOS transistor MN14 are turned off, so that the first input circuit 112 is turned on or off under control of the received first signal pair. At this time, the third signal Sn− and the fourth signal Sp− outputted by the second comparison circuit 121 are logic low-level signals, so that the second input circuit 122 receiving the third signal Sn− and the fourth signal Sp− is turned off.

It is to be noted that, in the above description of the high level and the low level, the high level may be a level that is greater than or equal to a supply voltage, and the low level may be a level that is less than or equal to a grounding voltage. However, the high level and the low level are relative. Specifically, level ranges included in the high level and the low level may be determined according to specific devices. For example, for an NMOS transistor, the high level refers to the level range of a gate voltage that can turn on the NMOS transistor, and the low level refers to the level range of a gate voltage that can turn off the NMOS transistor. For a PMOS transistor, the low level refers to the level range of a gate voltage that can turn on the PMOS transistor, and the high level refers to the level range of a gate voltage that can turn off the PMOS transistor. In addition, the high level may be the logic level 1 in the foregoing description, and the low level may be the logic level 0 in the foregoing description.

To sum up, the second amplification circuit 102 may be further controlled by means of the enable signal EnDfe, so as to determine whether to consider the impact of the intersymbol interference of data received by the data receiving circuit 100 on the data receiving circuit 100. For example, when the impact of the intersymbol interference on the data receiving circuit 100 is required to be reduced, the enable signal EnDfe is set to be at the first level, and the second amplification circuit 102 selectively receives one of the first signal pair and the second signal pair that has a larger level difference based on the current enable signal EnDfe and the feedback signal fb, so as to ensure that the second amplification circuit 102 receives a pair of differential signals with a larger signal level difference. When the impact of the intersymbol interference on the data receiving circuit 100 is not required to be considered, the enable signal EnDfe is set to be at the second level, and the second amplification circuit 102 keeps receiving the first signal pair based on the current enable signal EnDfe, so as to achieve an effect of reducing the power consumption of the data receiving circuit 100 while improving the receiving performance of the data receiving circuit 100.

Figure 2:
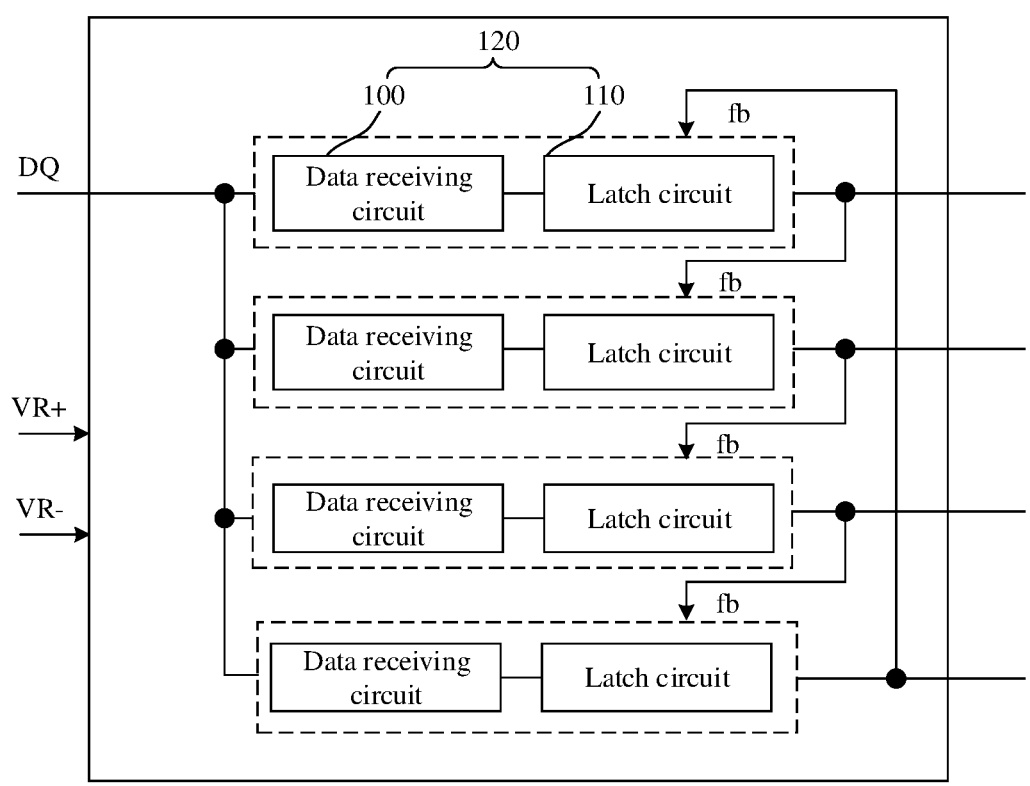
FIG. 2 is a functional block diagram of a data receiving system according to another embodiment of the disclosure.

Another embodiment of the disclosure further provides a data receiving system. The data receiving system provided in another embodiment of the disclosure is described in detail below with reference to the drawings. FIG. 2 is a functional block diagram of a data receiving system according to another embodiment of the disclosure.

Referring to FIG. 2, the data receiving system includes: a plurality of cascaded data transmission circuits 120, each of which includes the data receiving circuit 100 provided in an embodiment of the disclosure and a latch circuit 110 connected to the data receiving circuit 100. An output signal of the data transmission circuit 120 at the previous stage is used as a feedback signal fb of the data transmission circuit 120 at the next stage. An output signal of the data transmission circuit 120 at the last stage is used as a feedback signal fb of the first stage data transmission circuit 120.

The latch circuit 110 is in one-to-one correspondence with the data receiving circuit 100. The latch circuit 110 is configured to latch and output a signal outputted by the data receiving circuit 100 corresponding to the latch circuit 110.

In some embodiments, the data receiving circuit 100 receives data in response to a sampling clock signal. The data receiving system includes 4 cascaded data transmission circuits 100, and a phase difference between the sampling clock signals clkN of the adjacent stage data receiving circuits 100 is 90°. Therefore, a period of the sampling clock signal clkN is 2 times of the period of the data signal DQ received by a data port, which facilitates clock wiring and reduction of power consumption.

It is to be noted that, in FIG. 2, for example, the data receiving system includes 4 cascaded data receiving circuits 100, and the phase difference between the sampling clock signals of the adjacent stage data receiving circuits 100 is 90°. In the practical application, the number of the cascaded data receiving circuits 100 included in the data receiving system is not limited, and a phase difference between the sampling clock signals of the adjacent stage data receiving circuits 100 may be reasonably set based on the number of the cascaded data receiving circuits 100.

In some embodiments, the first output signal Vout and the second output signal VoutN outputted by the second amplification circuit 102 of the data receiving circuit 100 at the previous stage are used as the feedback signals fb of the data receiving circuit 100 at the subsequent stage. Therefore, the output of the data receiving circuit 100 is directly transmitted to the data transmission circuit 120 at the next stage without passing through the latch circuit 110, so that the transmission delay of data can be reduced. Alternatively, a signal outputted by the latch circuit 110 at the previous stage is used as the feedback signal fb of the data receiving circuit 100 at the subsequent stage.

To sum up, according to the data receiving system provided in another embodiment of the disclosure, the second amplification circuit 102 may be further controlled by means of the enable signal EnDfe, so as to determine whether to consider the impact of the intersymbol interference of data received by the data receiving circuit 100 on the data receiving circuit 100. For example, when the impact of the intersymbol interference on the data receiving circuit 100 is required to be reduced, the enable signal EnDfe is set to be at the first level, and the second amplification circuit 102 selectively receives one of the first signal pair and the second signal pair that has a larger level difference based on the current enable signal EnDfe and the feedback signal fb, so as to ensure that the second amplification circuit 102 receives a pair of differential signals with a larger signal level difference. Therefore, the accuracy of the first output signal Vout and the second output signal VoutN outputted by the second amplification circuit 102 can be enhanced, thereby improving the receiving performance of the data receiving system. When the impact of the intersymbol interference on the data receiving circuit 100 is not required to be considered, the enable signal EnDfe is set to be at the second level, and the second amplification circuit 102 keeps receiving the first signal pair based on the current enable signal EnDfe, so as to reduce the power consumption of the data receiving system.

Still another embodiment of the disclosure further provides a memory device, including: a plurality of data ports; and a plurality of data receiving systems provided in the another embodiment of the disclosure, each of which corresponds to a respective data port. Therefore, when the impact of the intersymbol interference on the memory device is required to be reduced, each data port in the memory device may flexibly adjust the received data signal DQ by using the data receiving system, and improve the ability of adjusting the first output signal Vout and the second output signal VoutN, so that the receiving performance of the memory device can be improved. When the impact of the intersymbol interference on the memory device is not required to be considered, the enable signal EnDfe is set to be at the second level, and the second amplification circuit 102 keeps receiving the first signal pair based on the current enable signal EnDfe, so as to reduce the power consumption of the memory device.

Those of ordinary skill in the art may understand that the above implementations are specific examples for realizing the disclosure, and in practical application, various changes may be made in form and details without departing from the spirit and the scope of the embodiments of the disclosure. Any person skilled in the art may make respective changes and modifications without departing from the spirit and scope of the embodiments of the disclosure. Therefore, the protection scope of the embodiments of the disclosure should be subject to the scope defined by the claims.

The invention claimed is:

1. A data receiving circuit, comprising:
   a first amplification circuit, configured to receive a data signal, a first reference signal and a second reference signal, perform first comparison on the data signal and the first reference signal in response to a sampling clock signal and output a first signal pair as a result of the first comparison, and perform second comparison on the data signal and the second reference signal, and output a second signal pair as a result of the second comparison, wherein a level of the first reference signal is different from a level of the second reference signal, the first signal pair comprises a first signal and a second signal, and the second signal pair comprises a third signal and a fourth signal; and
   a second amplification circuit, configured to receive an enable signal and a feedback signal, selectively receive the first signal pair or the second signal pair as an input signal pair based on the feedback signal during a period in which the enable signal is at a first level, receive the first signal pair as the input signal pair during a period in which the enable signal is at a second level, amplify a voltage difference of the input signal pair, and output a first output signal and a second output signal as an amplification result, wherein the feedback signal is obtained based on previously received data.

2. The data receiving circuit of claim 1, wherein the first amplification circuit is further configured to receive the enable signal, perform the first comparison to output the first signal pair and perform the second comparison to output the second signal pair during the period in which the enable signal is at the first level, and merely perform the first comparison to output the first signal pair during the period in which the enable signal is at the second level, wherein a level of the first reference signal is greater than a level of the second reference signal.

3. The data receiving circuit of claim 2, wherein the sampling clock signal comprises a first sampling clock signal and a second sampling clock signal; and the first amplification circuit comprises:
   a first comparison circuit, having a first node and a second node, and configured to receive the data signal and the first reference signal, perform the first comparison in response to the first sampling clock signal, output the first signal through the first node, and output the second signal through the second node;
   a clock generation circuit, configured to receive the enable signal and an original sampling clock signal, and output the second sampling clock signal, wherein a phase of the second sampling clock signal is opposite to a phase of the original sampling clock signal during the period in which the enable signal is at the first level, and the second sampling clock signal is a logic high-level signal during the period in which the enable signal is at the second level; and
   a second comparison circuit, having a third node and a fourth node, and configured to receive the data signal and the second reference signal, perform the second comparison in response to the second sampling clock signal during the period in which the enable signal is at the first level, output the third signal through the third node and output the fourth signal through the fourth node, turn on a connection path between the third node and ground when the enable signal is at the second level, and turn on a connection path between the fourth node and ground.

4. The data receiving circuit of claim 3, wherein the first comparison circuit comprises:
   a first current source, connected between a power node and a fifth node, and configured to supply a current to the fifth node in response to the first sampling clock signal;
   a first comparator, connected to the first node, the second node and the fifth node, and configured to receive the data signal and the first reference signal, perform the first comparison when the first current source supplies the current to the fifth node, and output the first signal and the second signal; and
   a first reset circuit, connected to the first node and the second node, and configured to reset the first node and the second node in response to the first sampling clock signal; and
   the second comparison circuit comprises:
   a second current source, connected between the power node and a sixth node, and configured to supply a current to the sixth node in response to the second sampling clock signal;
   a second comparator, connected to the third node, the fourth node and the sixth node, and configured to receive the data signal and the second reference signal, perform the second comparison when the second current source supplies the current to the sixth node, and output the third signal and the fourth signal; and
   a second reset circuit, connected between the third node and the fourth node, and configured to reset the third node and the fourth node in response to the second sampling clock signal.

5. The data receiving circuit of claim 4, wherein the first current source comprises:
   a first PMOS transistor, connected between the power node and the fifth node, wherein a gate of the first PMOS transistor is configured to receive the first sampling clock signal; and
   the second current source comprises:
   a second PMOS transistor, connected between the power node and the sixth node, wherein a gate of the second PMOS transistor is configured to receive the second sampling clock signal.

6. The data receiving circuit of claim 4, wherein the first comparator comprises:
   a third PMOS transistor, connected between the first node and the fifth node, wherein a gate of the third PMOS transistor is configured to receive the data signal; and a fourth PMOS transistor, connected between the second node and the fifth node, wherein a gate of the fourth PMOS transistor is configured to receive the first reference signal; and the second comparator comprises:

a fifth PMOS transistor, connected between the third node and the sixth node, wherein a gate of the fifth PMOS transistor is configured to receive the data signal; and a sixth PMOS transistor, connected between the fourth node and the sixth node, wherein a gate of the sixth PMOS transistor is configured to receive the second reference signal.

7. The data receiving circuit of claim 4, wherein the first reset circuit comprises:

a first NMOS transistor, connected between the first node and ground, wherein a gate of the first NMOS transistor is configured to receive the first sampling clock signal; and a second NMOS transistor, connected between the second node and ground, wherein a gate of the second NMOS transistor is configured to receive the first sampling clock signal; and the second reset circuit comprises:

a third NMOS transistor, connected between the third node and ground, wherein a gate of the third NMOS transistor is configured to receive the second sampling clock signal; and a fourth NMOS transistor, connected between the fourth node and ground, wherein a gate of the fourth NMOS transistor is configured to receive the second sampling clock signal.

8. The data receiving circuit of claim 3, wherein the clock generation circuit comprises:

a first NAND gate circuit, wherein a first input of the first NAND gate circuit is configured to receive the original sampling clock signal, a second input of the first NAND gate circuit is connected to a power node, and an output of the first NAND gate circuit is configured to output the first sampling clock signal.

9. The data receiving circuit of claim 3, wherein the clock generation circuit comprises:

a second NAND gate circuit, wherein one input of the second NAND gate circuit is configured to receive the original sampling clock signal, and the other input of the second NAND gate circuit is configured to receive the enable signal; and an output of the second NAND gate circuit is configured to output the second sampling clock signal.

10. The data receiving circuit of claim 1, wherein the second amplification circuit comprises:

a decision equalization enable circuit, configured to receive the feedback signal and the enable signal;

a first input circuit, connected to a seventh node and an eighth node, and configured to be connected to the decision equalization enable circuit, be turned on under control of the decision equalization enable circuit, receive the first signal pair, perform a third comparison, and provide signals to the seventh node and the eighth node respectively as a result of the third comparison;

a second input circuit, connected to the seventh node and the eighth node, and configured to be connected to the decision equalization enable circuit, be turned on under control of the decision equalization enable circuit, receive the second signal pair, perform a fourth comparison, and provide signals to the seventh node and the eighth node respectively as a result of the fourth comparison, wherein the first input circuit and the second input circuit are alternatively turned on under control of the decision equalization enable circuit; and a latch, connected to the seventh node and the eighth node, and configured to amplify and latch the signal of the seventh node and the signal of the eighth node, and output the first output signal through a first output node and output the second output signal through a second output node.

11. The data receiving circuit of claim 10, wherein the feedback signal comprises a differential first feedback signal and a second feedback signal; and the decision equalization enable circuit comprises:

a first enable circuit, connected between ground and the first input circuit and between ground and the second input circuit, and configured to receive the enable signal, the first feedback signal and the second feedback signal, to control one of the first input circuit and the second input circuit to be connected to ground; and a second enable circuit, connected between ground and the first input circuit and between ground and the second input circuit, and configured to receive a complementary enable signal, to control the first input circuit to be connected to ground, wherein a level of the complementary enable signal is opposite to a level of the enable signal; wherein the first enable circuit and the second enable circuit are alternatively selected to be turned on.

12. The data receiving circuit of claim 11, wherein the first input circuit comprises:

a fifth NMOS transistor, wherein a drain of the fifth NMOS transistor is connected to the seventh node, a source of the fifth NMOS transistor is connected to the first enable circuit and the second enable circuit, and a gate of the fifth NMOS transistor is configured to receive the first signal; and a sixth NMOS transistor, wherein a drain of the sixth NMOS transistor is connected to the eighth node, a source of the sixth NMOS transistor is connected to the first enable circuit and the second enable circuit, and a gate of the sixth NMOS transistor is configured to receive the second signal; and the second input circuit comprises:

a seventh NMOS transistor, wherein a drain of the seventh NMOS transistor is connected to the seventh node, a source of the seventh NMOS transistor is connected to the first enable circuit and the second enable circuit, and a gate of the seventh NMOS transistor is configured to receive the third signal; and an eighth NMOS transistor, wherein a drain of the eighth NMOS transistor is connected to the eighth node, a source of the eighth NMOS transistor is connected to the first enable circuit and the second enable circuit, and a gate of the eighth NMOS transistor is configured to receive the fourth signal.

13. The data receiving circuit of claim 12, wherein the first enable circuit comprises:

a ninth NMOS transistor and a tenth NMOS transistor, wherein a drain of the ninth NMOS transistor is connected to the source of the fifth NMOS transistor and the source of the sixth NMOS transistor, a source of the ninth NMOS transistor is connected to a drain of the tenth NMOS transistor, a gate of the ninth NMOS transistor is configured to receive the first feedback signal, a gate of the tenth NMOS transistor is configured to receive the enable signal, and a source of the tenth NMOS transistor is connected to ground; and an eleventh NMOS transistor and a twelfth NMOS transistor, wherein a drain of the eleventh NMOS transistor is connected to the source of the seventh NMOS transistor and the source of the eighth NMOS transistor, a source of the eleventh NMOS transistor is connected to a drain of the twelfth NMOS transistor, a gate of the eleventh NMOS transistor is configured to receive the second feedback signal, a gate of the twelfth NMOS transistor is configured to receive the enable signal, and a source of the twelfth NMOS transistor is connected to ground, and wherein the second enable circuit comprises:
a thirteenth NMOS transistor, wherein a drain of the thirteenth NMOS transistor is connected to the source of the fifth NMOS transistor and the source of the sixth NMOS transistor, a source of the thirteenth NMOS transistor is connected to ground, and a gate of the thirteenth NMOS transistor is configured to receive the complementary enable signal; and a fourteenth NMOS transistor, wherein a drain of the fourteenth NMOS transistor is connected to the source of the seventh NMOS transistor and the source of the eighth NMOS transistor, a source of the fourteenth NMOS transistor is connected ground, and a gate of the fourteenth NMOS transistor is configured to receive the complementary enable signal.

14. The data receiving circuit of claim 10, wherein the latch comprises:
a fifteenth NMOS transistor and a seventh PMOS transistor, wherein a gate of the fifteenth NMOS transistor and a gate of the seventh PMOS transistor are connected to the second output node, a source of the fifteenth NMOS transistor is connected to the seventh node, a drain of the fifteenth NMOS transistor and a drain of the seventh PMOS transistor are connected to the first output node, and a source of the seventh PMOS transistor is connected to a power node; and a sixteenth NMOS transistor and an eighth PMOS transistor, wherein a gate of the sixteenth NMOS transistor and a gate of the eighth PMOS transistor are connected to the first output node, a source of the sixteenth NMOS transistor is connected to the eighth node, a drain of the sixteenth NMOS transistor and a drain of the eighth PMOS transistor are connected to the second output node, and a source of the eighth PMOS transistor is connected to the power node.

15. The data receiving circuit of claim 14, wherein the second amplification circuit further comprises:
a third reset circuit, connected between the power node and an output of the latch, and configured to reset the output of the latch.

16. The data receiving circuit of claim 15, wherein the third reset circuit comprises:
a ninth PMOS transistor, connected between the first output node and the power node, wherein a gate of the ninth PMOS transistor is configured to receive an original sampling clock signal; and a tenth PMOS transistor, connected between the second output node and the power node, wherein a gate of the tenth PMOS transistor is configured to receive the original sampling clock signal.

17. A data receiving system, comprising:
a plurality of cascaded data transmission circuits, each of which comprises a data receiving circuit and a latch circuit connected to the data receiving circuit, wherein each data receiving circuit comprises:
a first amplification circuit, configured to receive a data signal, a first reference signal and a second reference signal, perform first comparison on the data signal and the first reference signal in response to a sampling clock signal and output a first signal pair as a result of the first comparison, and perform second comparison on the data signal and the second reference signal, and output a second signal pair as a result of the second comparison, wherein a level of the first reference signal is different from a level of the second reference signal, the first signal pair comprises a first signal and a second signal, and the second signal pair comprises a third signal and a fourth signal; and a second amplification circuit, configured to receive an enable signal and a feedback signal, selectively receive the first signal pair or the second signal pair as an input signal pair based on the feedback signal during a period in which the enable signal is at a first level, receive the first signal pair as the input signal pair during a period in which the enable signal is at a second level, amplify a voltage difference of the input signal pair, and output a first output signal and a second output signal as an amplification result, wherein the feedback signal is obtained based on previously received data;

an output signal of a data transmission circuit at a previous stage is used as a feedback signal of a data transmission circuit at a subsequent stage; wherein the previous stage and the subsequent stage is adjacent to each other; and an output signal of a data transmission circuit at a last stage is used as a feedback signal of a data transmission circuit at a first stage.

18. The data receiving system of claim 17, wherein each data receiving circuit is configured to receive data in response to a sampling clock signal; and the data receiving system comprises 4 cascaded data transmission circuits, and a phase difference between the sampling clock signals of the data receiving circuits at adjacent stages is 90°.

19. The data receiving system of claim 17, wherein a first output signal and a second output signal outputted by a second amplification circuit of the data receiving circuit at the previous stage are used as feedback signals of the data receiving circuit at the subsequent stage; or a signal outputted by the latch circuit at the previous stage is used as the feedback signal of the data receiving circuit at subsequent stage.

* * * * *